(12) United States Patent
Lee

(10) Patent No.: US 12,514,071 B2
(45) Date of Patent: Dec. 30, 2025

(54) DISPLAY DEVICE INCLUDING CONCAVE PORTION

(71) Applicant: Samsung Display Co., LTD., Yongin-si (KR)

(72) Inventor: Jun Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 390 days.

(21) Appl. No.: 18/122,275

(22) Filed: Mar. 16, 2023

(65) Prior Publication Data

US 2024/0057391 A1  Feb. 15, 2024

(30) Foreign Application Priority Data

Aug. 12, 2022  (KR) .................. KR10-2022-0101094

(51) Int. Cl.
  *H10K 59/122*  (2023.01)
  *H10K 59/35*  (2023.01)
  *H10K 59/38*  (2023.01)
  *H10K 59/80*  (2023.01)

(52) U.S. Cl.
  CPC ......... *H10K 59/122* (2023.02); *H10K 59/353* (2023.02); *H10K 59/38* (2023.02); *H10K 59/8792* (2023.02)

(58) Field of Classification Search
  CPC ...... H10K 59/38; H10K 50/86; H10K 59/353; H10K 59/8792; H10K 59/122
  See application file for complete search history.

(56) References Cited

U.S. PATENT DOCUMENTS

| | | | |
|---|---|---|---|
| 10,886,343 B2 | 1/2021 | Zhang et al. | |
| 2012/0007067 A1* | 1/2012 | Kaneta | H10K 50/15 438/46 |
| 2018/0366524 A1* | 12/2018 | Bang | H10K 50/822 |
| 2019/0013371 A1* | 1/2019 | Kim | H10K 71/135 |
| 2019/0326545 A1* | 10/2019 | Joo | H10K 59/38 |
| 2020/0266392 A1* | 8/2020 | Lee | G06F 3/0446 |
| 2020/0373364 A1* | 11/2020 | Yoon | H10K 59/122 |
| 2024/0298509 A1* | 9/2024 | Gong | H10K 50/865 |
| 2024/0315081 A1* | 9/2024 | Luo | H10K 59/122 |

FOREIGN PATENT DOCUMENTS

| | | |
|---|---|---|
| CN | 113113453 | 7/2021 |
| KR | 10-2019-0006125 | 1/2019 |
| KR | 10-2020-0101552 | 8/2020 |

\* cited by examiner

*Primary Examiner* — Nduka E Ojeh
(74) *Attorney, Agent, or Firm* — Innovation Counsel LLP

(57) ABSTRACT

A display device includes a plurality of pixel electrodes spaced apart from each other on a substrate, a pixel defining layer including a plurality of openings spaced apart from each other and overlapping the plurality of pixel electrodes, a light blocking layer overlapping the plurality of openings and including a plurality of holes spaced apart from each other, and a plurality of color filters disposed in the plurality of holes on the light blocking layer and overlapping the plurality of openings. The pixel defining layer includes a first portion overlapping the light blocking layer and a second portion not overlapping the light blocking layer, the second portion includes a first concave portion recessed from a surface of the second portion in a thickness direction, and the plurality of color filters are disposed to partially overlap each other on the light blocking layer.

20 Claims, 26 Drawing Sheets

DISPLAY DEVICE INCLUDING CONCAVE PORTION

CROSS-REFERENCE TO RELATED APPLICATION(S)

This application claims priority to and benefits of Korean Patent Application No. 10-2022-0101094, filed on Aug. 12, 2022 in the Korean Intellectual Property Office, the entire contents of which are herein incorporated by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device or an organic light emitting display device. In a light emitting display device, since each pixel of a display panel includes a light emitting element capable of emitting light by itself, an image can be displayed without a backlight unit providing light to the display panel.

SUMMARY

Aspects of the disclosure provide a display device including a color filter disposed on a light emitting element, in which unevenness caused by reflection of external light is reduced.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a display device may include a plurality of pixel electrodes spaced apart from each other on a substrate, a pixel defining layer including a plurality of openings spaced apart from each other and overlapping the plurality of pixel electrodes, a light blocking layer overlapping the plurality of openings and including a plurality of holes spaced apart from each other, and a plurality of color filters disposed in the plurality of holes on the light blocking layer and overlapping the openings. The pixel defining layer may include a first portion overlapping the light blocking layer and a second portion not overlapping the light blocking layer, the second portion may include a first concave portion recessed from a surface of the second portion in a thickness direction, and the plurality of color filters may be disposed to partially overlap each other on the light blocking layer.

In an embodiment, the first concave portion may not overlap the light blocking layer.

In an embodiment, the first concave portion may be disposed at a boundary between the first portion and the second portion.

In an embodiment, a portion of the first concave portion disposed in the first portion may overlap the light blocking layer.

In an embodiment, the first concave portion may have a depth of about 0.3 μm to about 0.5 μm.

In an embodiment, the first concave portion may have a semicircular shape in cross-sectional view.

In an embodiment, the second portion of the pixel defining layer may include a top surface parallel to the substrate and a side surface extended to the top surface, and the first concave portion may be disposed on the top surface of the second portion.

In an embodiment, the second portion may further include a second concave portion spaced apart from the first concave portion and disposed on the side surface of the second portion, and the second concave portion may be recessed from a surface of the side surface in the thickness direction of the second portion.

In an embodiment, a width of the second concave portion may be different from a width of the first concave portion.

In an embodiment, a depth of the second concave portion may be different from a depth of the first concave portion.

In an embodiment, the second portion of the pixel defining layer may include a top surface parallel to the substrate and a side surface extended to the top surface, and the first concave portion may be positioned at a boundary between the top surface and the side surface.

In an embodiment, the first concave portion may have a width of about 3 μm to about 5 μm.

According to an aspect of the disclosure, a display device may include a plurality of pixel electrodes disposed in a first direction and a second direction intersecting the first direction, a pixel defining layer overlapping the plurality of pixel electrodes and including a plurality of openings spaced apart from each other, a light blocking layer overlapping the plurality of openings and including a plurality of holes spaced apart from each other, and a plurality of color filters disposed in the plurality of holes of the light blocking layer and overlapping the plurality of openings. The pixel defining layer may include a plurality of first concave portions positioned in exposed portions of the pixel defining layer exposed by the plurality of holes, and spaced apart from each other, and the plurality of first concave portions may be disposed to surround side edges of the plurality of openings in a plan view.

In an embodiment, a minimum distance between the plurality of first concave portions adjacent to each other may be about 3 μm to about 7 μm.

In an embodiment, the plurality of first concave portions may not overlap the light blocking layer.

In an embodiment, the display device may further include a plurality of second concave portions spaced apart from the side edges of the plurality of openings with the plurality of first concave portions interposed therebetween and disposed in the exposed portions of the pixel defining layer, wherein the plurality of second concave portions are spaced apart from each other and are disposed to surround the side edges of the plurality of openings in a plan view.

In an embodiment, a distance between centers of the plurality of first concave portions adjacent to each other may be about 5 μm to about 7 μm.

In an embodiment, the display device may further include a plurality of second concave portions disposed in the exposed portions of the pixel defining layer, and disposed between the plurality of first concave portions to surround the side edges of the plurality of openings, wherein a width of the first concave portion is different from a width of the second concave portion.

In an embodiment, the plurality of first concave portions and the plurality of second concave portions are disposed alternately with each other.

In an embodiment, the plurality of first concave portions may not overlap the light blocking layer in a plan view, and the plurality of second concave portions may overlap a portion of the light blocking layer in a plan view.

The display device according to an embodiment may include a plurality of concave portions positioned in a pixel defining layer exposed by a hole of a light blocking layer and recessed in the thickness direction. In case that the external light is reflected by an electrode disposed on the pixel defining layer by the plurality of concave portions in the display device, diffraction interference of the reflected light may be dispersed. Accordingly, the display device may prevent the reflected light by the external light from being recognized as unevenness as a repeated pattern, and may provide a user with a comfortable feeling of use.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
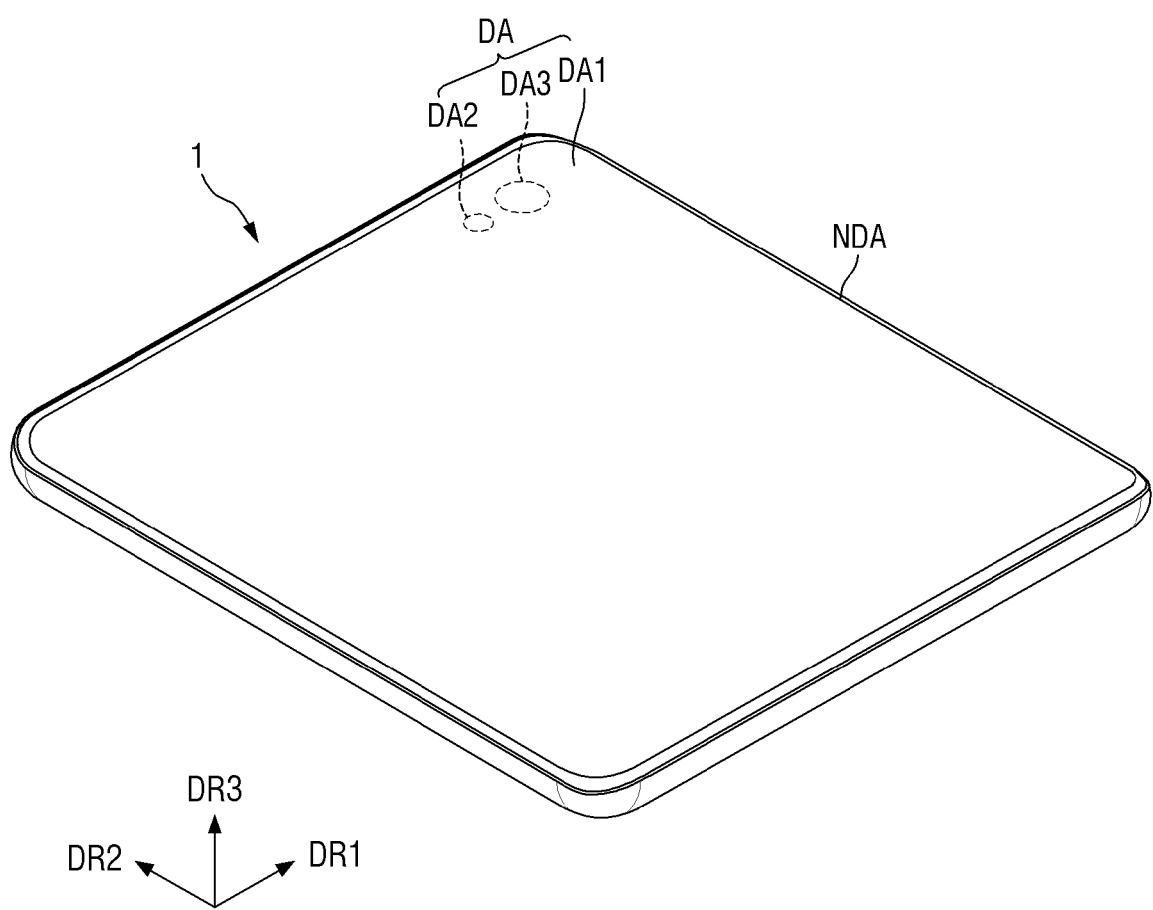
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be modified or combined with each other, in part or in whole, and technically various interlocking and driving are possible. Each embodiment may be implemented independently of each other or may be implemented together in an association.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display device according to an embodiment.

Referring to FIG. 1, an electronic device 1 displays a moving image or a still image. The electronic device 1 may refer to any electronic device providing a display screen. Examples of the electronic device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

Figure 2:
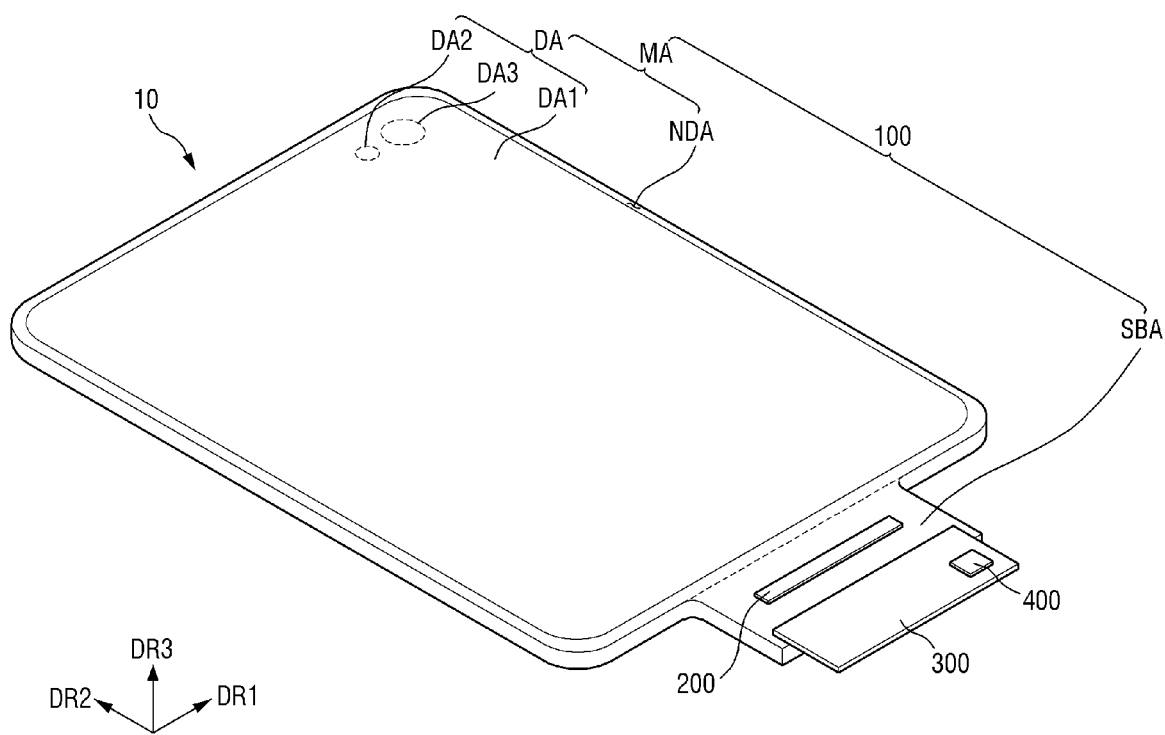
FIG. 2 is a schematic perspective view illustrating a display device included in an electronic device according to an embodiment.

The electronic device 1 may include a display device 10 in FIG. 2 providing a display screen. Examples of the display device may include an inorganic light emitting diode display device, an organic light emitting display device, a quantum dot light emitting display device, a plasma display device and a field emission display device. In the following description, a case where an organic light emitting diode display device is applied as a display device will be described as an example, but the disclosure is not limited thereto, and other display devices may be applied.

The shape of the electronic device 1 may be variously modified. For example, the electronic device 1 may have a shape such as a rectangular shape elongated in a horizontal direction, a rectangular shape elongated in a vertical direction, a square shape, a quadrilateral shape with rounded corners (vertices), other polygonal shapes and/or a circular shape. The shape of a display area DA of the electronic device 1 may also be similar to the overall shape of the electronic device 1. FIG. 1 illustrates the electronic device 1 having a rectangular shape elongated in a first direction DR1.

The electronic device 1 may include the display area DA and a non-display area NDA. The display area DA is an area where a screen can be displayed, and the non-display area NDA is an area where a screen may not be displayed. The display area DA may also be referred to as an active region, and the non-display area NDA may also be referred to as a non-active region. The display area DA may substantially occupy the center of the electronic device 1.

The display area DA may include a first display area DA1, a second display area DA2, and a third display area DA3. The second display area DA2 and the third display area DA3 are areas in which components for adding various functions to the electronic device 1 may be disposed, and the second display area DA2 and the third display area DA3 may correspond to a component area.

FIG. 2 is a schematic perspective view illustrating a display device included in an electronic device according to an embodiment.

Referring to FIG. 2, the electronic device 1 according to an embodiment may include the display device 10. The display device 10 may provide a screen displayed by the electronic device 1. The display device 10 may have a planar shape similar to the shape of the electronic device 1. For example, the display device 10 may have a shape similar to a quadrilateral shape having a side in the first direction DR1 and a side in the second direction DR2. The edge where the first side in the first direction DR1 and the second side in the second direction DR2 meet may be rounded to have a curvature, but is not limited thereto and may be formed at a right angle. The planar shape of the display device 10 is not limited to a quadrilateral shape, and may be formed in a shape similar to another polygonal shape, a circular shape, and/or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels displaying an image and the non-display area NDA disposed around the display area DA. The display area DA may include the first display area DA1, the second display area DA2, and the third display area DA3. The display area DA may emit light from multiple emission areas or multiple opening areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may be a region extending from one side of the main region MA. The sub-region SBA may include a flexible material which can be bent, folded and/or rolled. For example, in case that the sub-region SBA is bent, the sub-region SBA may overlap the main region MA in a thickness direction (third direction DR3). The sub-region SBA may include the display driver 200 and the pad unit connected to the circuit board 300. In some embodiments, the sub-region SBA may be omitted, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, and/or an ultrasonic bonding method. For example, the display driver 200 may be disposed in the sub-region SBA, and may overlap the main region MA in the thickness direction by bending of the sub-region SBA. As another example, the display driver 200 may be mounted on the circuit board 300.

The circuit board 300 may be attached to the pad unit of the display panel 100 by using an anisotropic conductive film (ACF). Lead lines of the circuit board 300 may be electrically connected to a pad unit of the display panel 100. The circuit board 300 may be a flexible printed circuit board, a printed circuit board, or a flexible film such as a chip on film.

A touch driver 400 may be mounted on the circuit board 300. The touch driver 400 may be electrically connected to a touch sensing unit included in the electronic device 1. The touch driver 400 may supply a touch driving signal to multiple touch electrodes of the touch sensing unit and may sense an amount of change in capacitance between the touch electrodes. For example, the touch driving signal may be a pulse signal having a predetermined or selectable frequency. The touch driver 400 may calculate whether an input is made and input coordinates based on an amount of change in capacitance between the touch electrodes. The touch driver 400 may be formed of an integrated circuit (IC).

Figure 3:
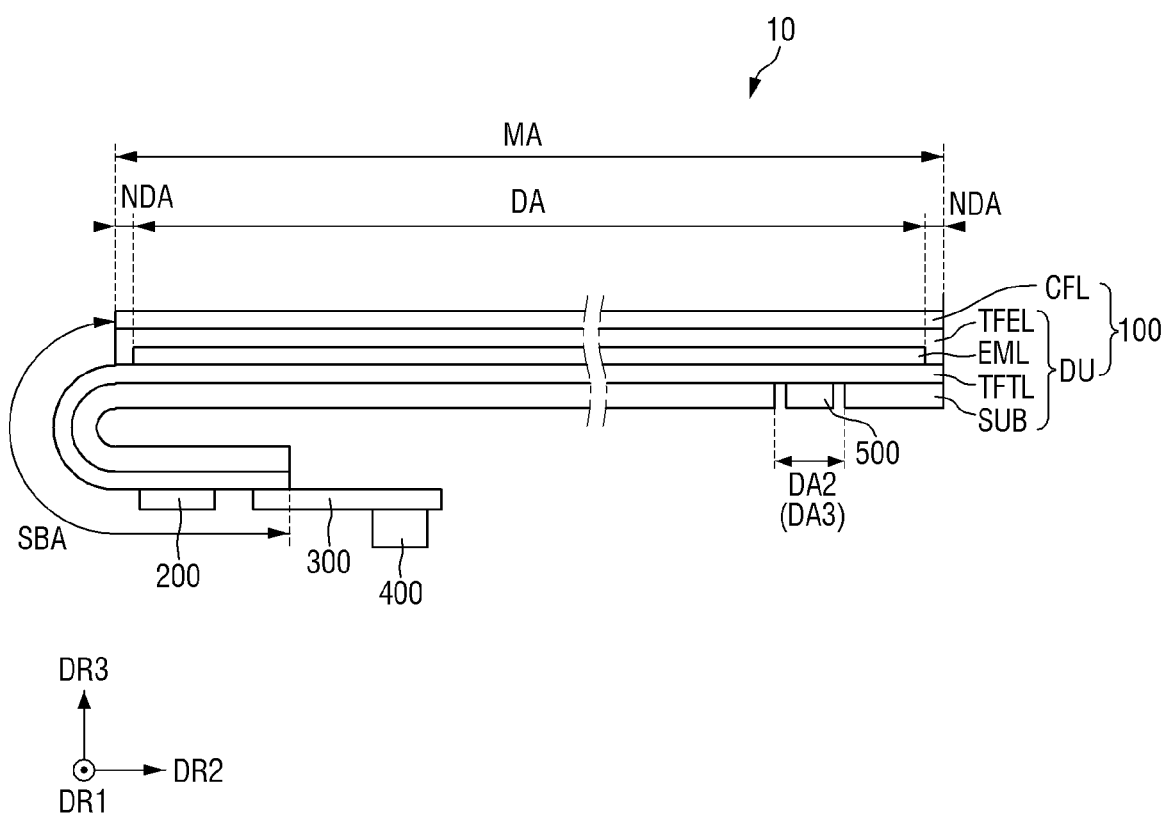
FIG. 3 is a schematic cross-sectional view of the display device of FIG. 2.

FIG. 3 is a schematic cross-sectional view of the display device of FIG. 2.

Referring to FIG. 3, the display panel 100 may include a display layer DU and a color filter layer CFL. The display layer DU may include the substrate SUB, the thin film transistor layer TFTL, the light emitting element layer EML, and the encapsulation layer TFEL.

The substrate SUB may be a base substrate or a base member. The substrate SUB may be a flexible substrate which can be bent, folded and/or rolled. For example, the substrate SUB may include a polymer resin such as polyimide (PI), but is not limited thereto. In some embodiments, the substrate SUB may include a glass material or a metal material.

The thin film transistor layer TFTL may be disposed on the substrate SUB. The thin film transistor layer TFTL may include multiple thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad unit. Each of the thin film transistors may include a semiconductor region, a source electrode, a drain electrode, and a gate electrode. For example, in case that the gate driver is formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include multiple light emitting elements each including a first electrode, a second electrode, and a light emitting layer to emit light, and a pixel defining layer defining pixels. The light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. In case that the first electrode receives a voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer.

In some embodiments, the light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EML, and may protect the light emitting element layer EML. The encapsulation layer TFEL may include at least one inorganic layer and at least one organic layer for encapsulating the light emitting element layer EML.

The color filter layer CFL may be disposed on the encapsulation layer TFEL. The color filter layer CFL may include multiple color filters respectively corresponding to the emission areas. Each of the color filters may selectively transmit light of a specific wavelength and may block or absorb light of a different wavelength. The color filter layer CFL may absorb a portion of light coming from the outside of the display device 10 to reduce reflected light due to external light. Accordingly, the color filter layer CFL may prevent color distortion caused by reflection of the external light.

Since the color filter layer CFL is directly disposed on the encapsulation layer TFEL, the display device 10 may not require a separate substrate for the color filter layer CFL. Accordingly, the thickness of the display device 10 may be relatively small.

In some embodiments, the display device 10 may further include an optical device 500. The optical device 500 may be disposed in the second display area DA2 or the third display area DA3. The optical device 500 may emit or receive light in infrared, ultraviolet, and visible light bands. For example, the optical device 500 may be an optical sensor that detects light incident on the display device 10 such as a proximity sensor, an illuminance sensor, and a camera sensor or an image sensor.

Figure 4:
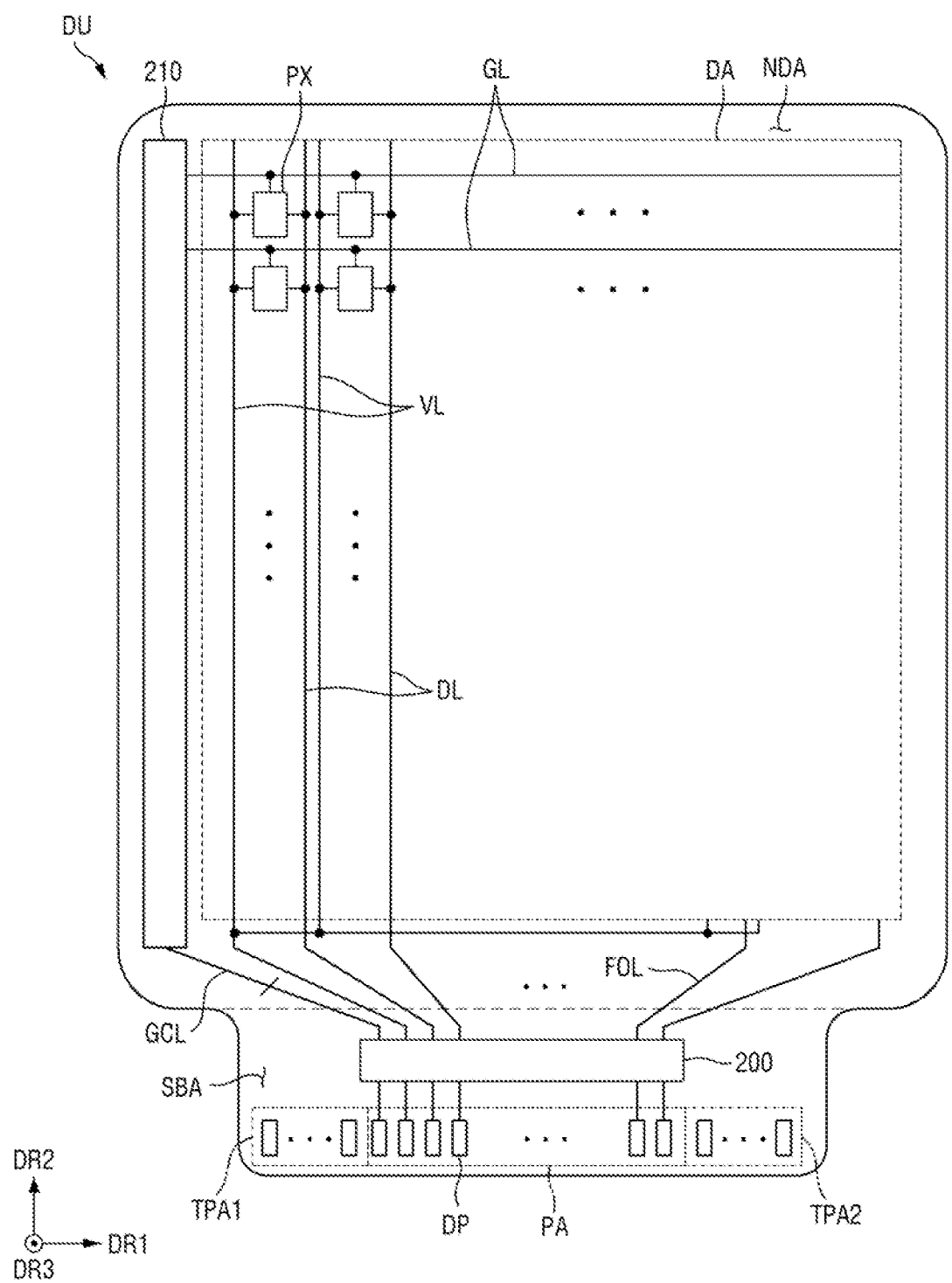
FIG. 4 is a schematic plan view illustrating a display layer of a display device according to an embodiment.

FIG. 4 is a schematic plan view illustrating a display layer of a display device according to an embodiment.

Referring to FIG. 4, the display layer DU may include the display area DA and the non-display area NDA.

The display area DA may be disposed at the center of the display panel 100. Multiple pixels PX, multiple gate lines GL, multiple data lines DL, and multiple power lines VL may be disposed in the display area DA. Each of the pixels PX may be defined as a minimum unit that emits light.

The gate lines GL may supply the gate signals received from the gate driver 210 to the pixels PX. The gate lines GL may extend in the first direction DR1 and may be spaced apart from each other in the second direction DR2 intersecting the first direction DR1.

The data lines DL may supply the data voltages received from the display driver 200 to the pixels PX. The data lines DL may extend in the second direction DR2 and may be spaced apart from each other in the first direction DR1.

The power lines VL may supply the power voltage received from the display driver 200 to the pixels PX. Here, the power voltage may be at least one of a driving voltage, an initialization voltage, a reference voltage, and a low potential voltage. The power lines VL may extend in the second direction DR2 and may be spaced apart from each other in the first direction DR1.

The non-display area NDA may surround the display area DA. A gate driver 210, fan-out lines FOL, and gate control lines GCL may be disposed in the non-display area NDA. The gate driver 210 may generate multiple gate signals based on the gate control signal, and may sequentially supply the gate signals to the gate lines GL according to a set order.

The fan-out lines FOL may extend from the display driver 200 to the display area DA. The fan-out lines FOL may supply the data voltage received from the display driver 200 to the data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the pixels PX, and the luminance of the pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a material such as an anisotropic conductive film or self assembly anisotropic conductive paste (SAP).

The pad area PA may include multiple display pad units DP. The display pad units DP may be connected to a graphic system through the circuit board 300. The display pad units DP may be connected to the circuit board 300 to receive digital video data, and may supply the digital video data to the display driver 200.

Figure 5:
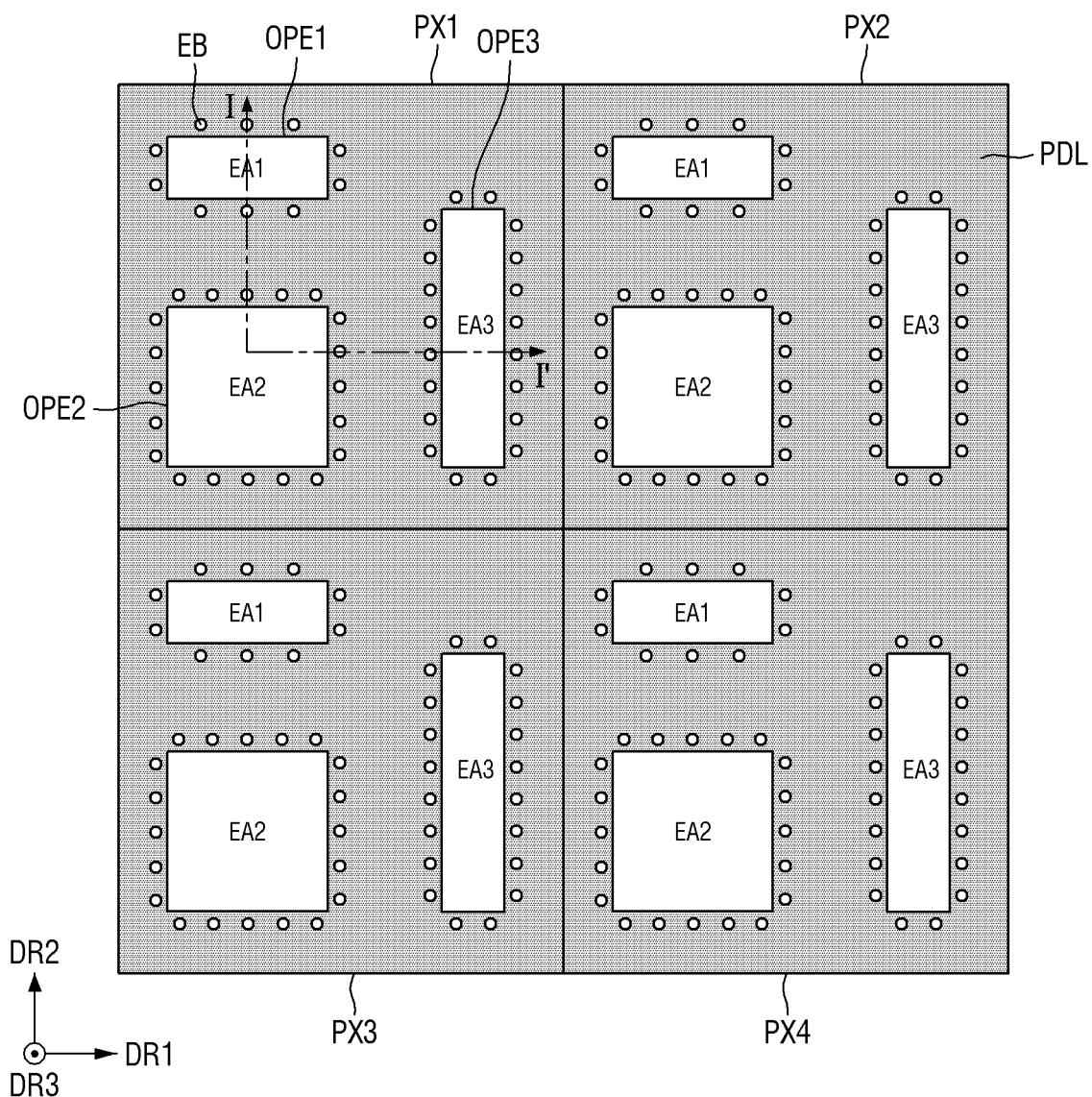
FIG. 5 is a schematic plan view of the disposition of the emission areas in the display area of the display device according to an embodiment.
Figure 6:
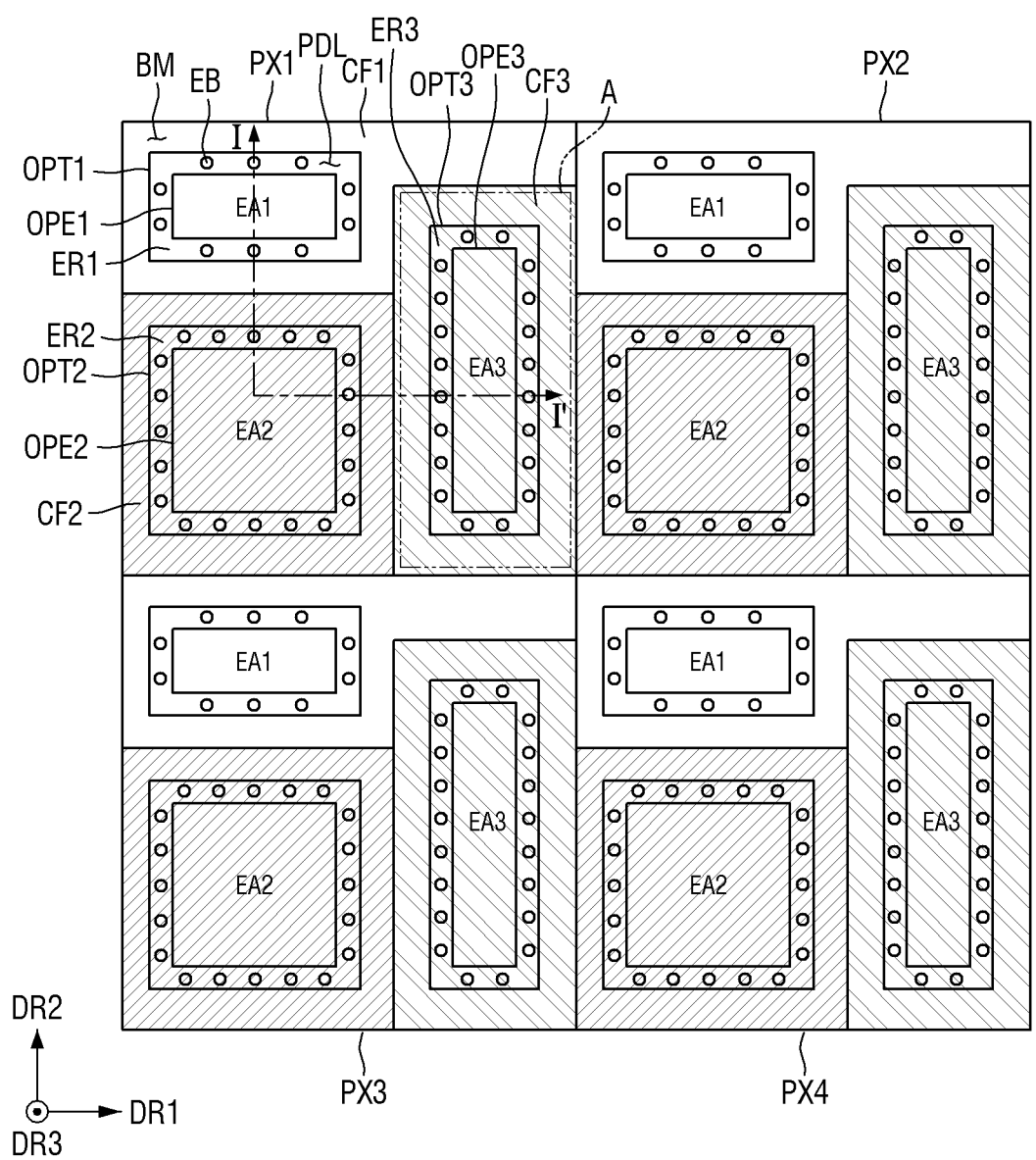
FIG. 6 is a schematic plan view illustrating the disposition of color filters disposed in the display area of FIG. 5.

FIG. 5 is a schematic plan view of the disposition of the emission areas in the display area of the display device according to an embodiment. FIG. 6 is a schematic plan view illustrating the disposition of color filters disposed in the display area of FIG. 5.

Referring to FIGS. 5 and 6, the display device 10 may include multiple pixels PX1, PX2, PX3, and PX4 disposed in the display area DA, and emission areas EA1, EA2, and EA3 disposed in each of the pixels PX1, PX2, PX3 and PX4. The display area DA illustrated in FIGS. 5 and 6 is the first display area DA1, and the pixels PX1, PX2, PX3, and PX4 and the emission areas EA1, EA2, and EA3 may be disposed in the first display area DA1. However, the pixels PX1, PX2, PX3, and PX4 and the emission areas EA1, EA2, and EA3 may be disposed also in the second display area DA2 and the third display area DA3 of the display area DA.

The pixels PX1, PX2, PX3, and PX4 may be arranged in the first direction DR1 and the second direction DR2. The first pixel PX1 and the second pixel PX2 may be disposed adjacent to each other in the first direction DR1, and the first pixel PX1 and the third pixel PX3 may be disposed adjacent to each other in the second direction DR2. The third pixel PX3 and the fourth pixel PX4 may be disposed adjacent to each other in the first direction DR1, and the second pixel PX2 and the fourth pixel PX4 may be disposed adjacent to each other in the second direction DR2. The pixels PX1, PX2, PX3, and PX4 may be arranged in a linear or island-like pattern in the display area DA.

However, the disposition or arrangement of the pixels PX1, PX2, PX3, and PX4 is not limited to those illustrated in FIGS. 5 and 6. In some embodiments, the pixels PX1, PX2, PX3, and PX4 may be disposed in a PenTile® type, for example, a diamond PenTile® type.

The emission areas EA1, EA2, and EA3 of each of the pixels PX1, PX2, PX3, and PX4 may include a first emission area EA1, a second emission area EA2, and a third emission area EA3 that emit light of different colors. The first to third emission areas EA1, EA2, and EA3 may emit red, green, or blue light, respectively, and the color of the light emitted from each of the emission areas EA1, EA2 and EA3 may be different depending on the type of a light emitting element ED in FIG. 7 disposed on a light emitting element layer EML to be described later. In an embodiment, the first emission area EA1 may emit first light of a red color, the second emission area EA2 may emit second light of a green color, and the third emission area EA3 may emit third light of a blue color. However, the disclosure is not limited thereto.

In the pixels PX1, PX2, PX3, and PX4, the emission areas EA1, EA2, and EA3 may be disposed in the first direction DR1, the second direction DR2, or a diagonal direction therebetween. For example, the first emission area EA1 and the second emission area EA2 may be disposed to be spaced apart from each other in the second direction DR2 in each of the pixels PX1, PX2, PX3, and PX4, and may be disposed to be alternately arranged in the second direction DR2 on the front surface of the display area DA. The first emission area EA1 of the third pixel PX3 may be disposed between the second emission area EA2 of the first pixel PX1 and the second emission area EA2 of the third pixel PX3. The third emission area EA3 may be disposed to be spaced apart in a diagonal direction with respect to the first emission area EA1 and the second emission area EA2 in each of the pixels PX1, PX2, PX3, and PX4, and multiple third emission areas EA3 may be repeatedly disposed in the second direction DR2 on the front surface of the display area DA. For example, the third emission area EA3 of the first pixel PX1 may be disposed between the second emission area EA2 of the first pixel PX1 and the second emission area EA2 of the second pixel PX2.

However, the disposition of the emission areas EA1, EA2, and EA3 is not limited to those illustrated in FIGS. 5 and 6. Similarly to the arrangement of the pixels PX1, PX2, PX3, and PX4, the emission areas EA1, EA2, and EA3 may be disposed in a PenTile® type, for example, a diamond PenTile® type.

The first to third emission areas EA1, EA2, and EA3 may be defined by multiple openings OPE1, OPE2, and OPE3 formed in the pixel defining layer PDL of the light emitting element layer EML, respectively. For example, the first emission area EA1 may be defined by the first opening OPE1 of the pixel defining layer, the second emission area EA2 may be defined by the second opening OPE2 of the pixel defining layer, and the third emission area EA3 may be defined by the third opening OPE3 of the pixel defining layer.

In some embodiments, the areas or sizes of the first to third emission areas EA1, EA2, and EA3 may be different from each other. In an embodiment of FIG. 5, the areas of the second emission area EA2 may be greater than the areas of the first emission area EA1 and the third emission area EA3, and the area of the third emission area EA3 may be greater than the area of the first emission area EA1. The areas of the emission areas EA1, EA2, and EA3 may vary according to the sizes of the openings OPE1, OPE2, and OPE3 formed in the pixel defining layer PDL. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. Although the area of the second emission area EA2 is the largest in FIG. 5, the disclosure is not limited thereto.

The areas of the emission areas EA1, EA2, and EA3 may be freely adjusted according to the color of the screen required by the display device 10 and the electronic device 1. The areas of the emission areas EA1, EA2, and EA3 may be related to light efficiency and the lifespan of the light emitting element ED, and may have a trade-off relation with the reflection by external light. The areas of the emission areas EA1, EA2, and EA3 may be adjusted in consideration of the above factors.

In the display device 10 having the disposition of the emission areas EA1, EA2, and EA3 as illustrated in FIG. 5, one first emission area EA1, one second emission area EA2, and one third emission area EA3 that are disposed adjacent to each other in each of the pixels PX1, PX2, PX3, and PX4 may form one pixel group. One pixel group may include the emission areas EA1, EA2, and EA3 emitting light of different colors to express a white gray scale. However, the disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the color filters CF (CF1, CF2, and CF3) disposed on the emission areas EA1, EA2, and EA3. The color filters CF1, CF2, and CF3 may be disposed to correspond to the emission areas EA1, EA2, and EA3, respectively. For example, the color filters CF1, CF2, and CF3 may be disposed on a light blocking layer BM including multiple holes OPT1, OPT2, and OPT3 disposed to correspond to the emission areas EA1, EA2, and EA3 or the openings OPE1, OPE2, and OPE3. The holes OPT1, OPT2, and OPT3 of the light blocking layer BM may be formed to overlap the openings OPE1, OPE2, and OPE3, and a light exit area from which the light emitted from the emission areas EA1, EA2, and EA3 is emitted may be formed.

As illustrated in FIGS. 5 and 6, in the pixels PX1, PX2, PX3, and PX4, the holes OPT1, OPT2, and OPT3 having an area larger than the area of the openings OPE1, OPE2, and OPE3 in plan view may be disposed to correspond to the openings OPE1, OPE2, and OPE3, so that a portion of the pixel defining layer PDL may be exposed. For example, the pixel defining layer PDL may include multiple exposed areas ER1, ER2, and ER3 exposed by the holes OPT1, OPT2, and OPT3. In other words, the exposed areas ER1, ER2, and ER3 may be an area of the pixel defining layer PDL positioned between the side edges of the openings OPE1, OPE2, and OPE3 of the pixel defining layer PDL and the side edges of the holes OPT1, OPT2, and OPT3 of the light blocking layer BM.

According to an embodiment of FIGS. 5 and 6, in the pixels PX1, PX2, PX3, and PX4, multiple concave portions EB may be disposed in the exposed areas ER1, ER2, and ER3 of the pixel defining layer PDL. The concave portions EB may be disposed to surround the emission areas EA1, EA2, and EA3, or the openings OPE1, OPE2, and OPE3. For example, the concave portions EB may be disposed to surround the side edges of the openings OPE1, OPE2, and OPE3.

As described above, the areas or sizes of the emission areas EA1, EA2, and EA3 or the openings OPE1, OPE2, and OPE3 may be different from each other, and thus depending on the areas or sizes of the emission areas EA1, EA2, and EA3 or the openings OPE1, OPE2, and OPE3, the number of concave portions EB that surround the emission areas EA1, EA2, and EA3 or the openings OPE1, OPE2, and OPE3 and are disposed in the exposed areas ER1, ER2, and ER3 may vary. For example, since the size of the third emission area EA3 may be larger than the size of the first emission area EA1, the number of concave portions EB disposed to surround the third emission area EA3 may be greater than the number of concave portions EB disposed to surround the first emission area EA1. However, the disclosure is not limited thereto, and in some embodiments, the number of concave portions EB surrounding the emission areas EA1, EA2, and EA3 or the openings OPE1, OPE2, and OPE3 according to the separation distance between the concave portions EB may be the same.

In an embodiment, the concave portions EB may have a circular shape in plan view. However, the shape of the concave portions EB in plan view is not limited thereto, and in some embodiments, the shape of the concave portions EB in plan view may have a polygonal shape. For example, the shape of the concave portions EB in plan view may be a quadrilateral shape or a rhombic shape.

Each of the color filters CF1, CF2, and CF3 may have a larger area than the holes OPT1, OPT2, and OPT3 of the light blocking layer and the openings OPE1, OPE2, and OPE3, and each of the color filters CF1, CF2, and CF3 may completely cover the light exit area formed by the holes OPT1, OPT2, and OPT3. The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to the color of the light emitted from the emission areas EA1, EA2, and EA3. For example, the first color filter CF1 may be a red color filter that is disposed to overlap the first emission area EA1 and transmits only the first light of the red color. The second color filter CF2 may be a green color filter that is disposed to overlap the second emission area EA2 and transmits only the second light of the green color, and the third color filter CF3 may be a blue color filter that is disposed to overlap the third emission area EA3 and transmits only the third light of the blue color.

Similarly to the disposition of the emission areas EA1, EA2, and EA3, the color filters CF1, CF2, and CF3 may be disposed in the first direction DR1, the second direction DR2, or a diagonal direction therebetween. For example, the first color filter CF1 and the second color filter CF2 may be disposed adjacent to each other in the second direction DR2, and may be alternately disposed in the second direction DR2 on the front surface of the display area DA. The first color filter CF1 disposed in the third pixel PX3 may be disposed between the second color filter CF2 disposed in the first pixel PX1 and the second color filter CF2 disposed in the third pixel PX3. The third color filter CF3 may be disposed adjacent to the first color filter CF1 and the second color filter CF2 in a diagonal direction or the first direction DR1, and the third emission areas EA3 may be repeatedly disposed in the second direction DR2 in the front surface of the display area DA. For example, the third color filter CF3 disposed in the first pixel PX1 may be disposed between the second color filter CF2 disposed in the first pixel PX1 and the second color filter CF2 disposed in the second pixel PX2.

In some embodiments, the first color filter CF1 may include a portion disposed to overlap the first emission area EA1 and another portion protruding from the portion in the first direction DR1 and disposed to abut the third color filter CF3 in the second direction DR2. The third color filter CF3 may be disposed between the protruding portion of the first color filter CF1 disposed in the first pixel PX1 and the protruding portion of the first color filter CF1 disposed in the third pixel PX3. In an area occupied by each of the pixels PX1, PX2, PX3, and PX4, the first color filter CF1 may have a shape different from the shape of other color filters. The area fraction of the first color filter CF1 among the color filters CF1, CF2, and CF3 may be greater with respect to the area of the emission areas EA1, EA2, and EA3 within a unit area. The relative area fractions of the color filters CF1, CF2, and CF3 may affect the color of the reflected external light in case that the external light is reflected by the display device 10, and the first color filter CF1, which is a red color filter, has an area with a relatively large ratio, so that the color of the external light may have a color comfortable to the user's eyes. However, the disposition of the color filters CF1, CF2, and CF3 is not limited to those illustrated in FIGS. 5 and 6. Similarly to the arrangement of the emission areas EA1, EA2, and EA3, the color filters CF1, CF2, and CF3 may be disposed in a PenTile® type, for example, a diamond PenTile® type. The disposition of the protruding portion of the first color filter CF1 may also be different from the disposition illustrated in FIG. 6.

According to an embodiment, the color filters CF1, CF2, and CF3 may be disposed to partially overlap other adjacent color filters CF1, CF2, and CF3. FIG. 6 illustrates that the color filters CF1, CF2, and CF3 adjacent to each other are disposed to abut each other, but as will be described later, the adjacent color filters CF1, CF2, and CF3 may partially overlap at the boundary in which the adjacent color filters CF1, CF2, and CF3 abut each other. FIG. 6 illustrates the disposition of the color filters CF1, CF2, and CF3 as viewed from above, and it may be understood that among the color filters CF1, CF2, and CF3 overlapping each other, the edges of the color filters CF1, CF2, and CF3 disposed below are covered by the color filters CF1, CF2, and CF3 disposed above the edges. The different color filters CF1, CF2, and CF3 may be areas that do not overlap the emission areas EA1, EA2, and EA3, and may overlap each other on the light blocking layer BM to be described later.

In the display device 10, the color filters CF1, CF2, and CF3 may be disposed to overlap each other, so that the intensity of the reflected light by external light may be reduced. Furthermore, the color of the reflected light by the external light may be controlled by adjusting the disposition, shape, and area of the color filters CF1, CF2, and CF3 in plan view.

Figure 7:
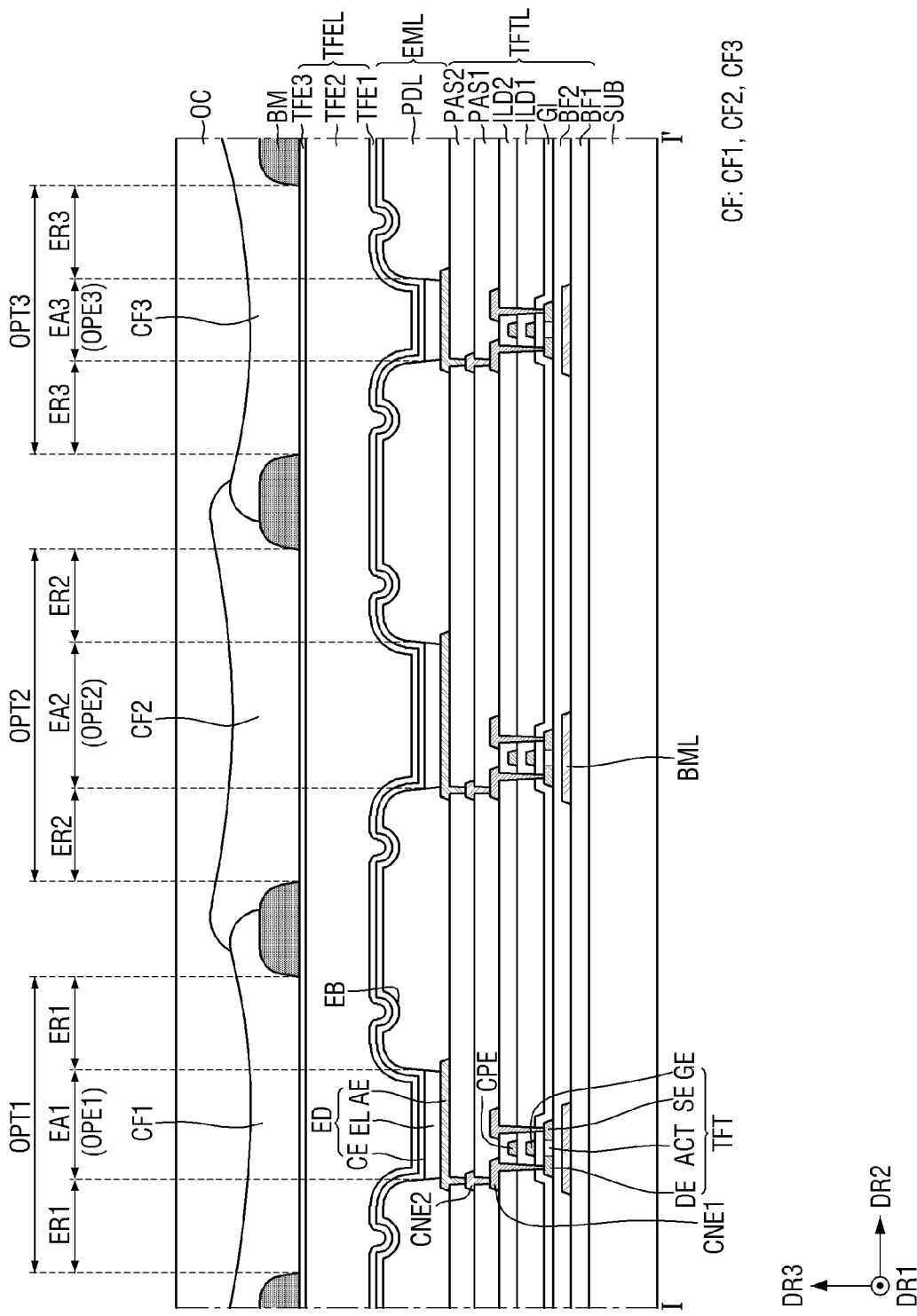
FIG. 7 is a schematic cross-sectional view taken along line I-I' of FIG. 6.

FIG. 7 is a schematic cross-sectional view taken along line I-I' of FIG. 6.

Specifically, FIG. 7 illustrates a cross section crossing the first emission area EA1, the second emission area EA2, and the third emission area EA3.

A cross-sectional structure of the display device 10 will be described with reference to FIG. 7 in addition to FIGS. 5 and 6.

As described above in connection with FIG. 3, the display panel 100 of the display device 10 may include the display layer DU and the color filter layer CFL. The display layer DU may include the substrate SUB, the thin film transistor layer TFTL, the light emitting element layer EML, and the encapsulation layer TFEL. The display panel 100 may include the light blocking layer BM disposed on the encapsulation layer TFEL, and the color filters CF1, CF2, and CF3 of the color filter layer CFL may be disposed on the light blocking layer BM.

The substrate SUB may be a base substrate or a base member. The substrate SUB may be a flexible substrate which can be bent, folded and/or rolled. For example, the substrate SUB may include a polymer resin such as polyimide (PI), but is not limited thereto. As another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include multiple inorganic layers alternately stacked on each other.

The lower metal layer BML may be disposed on the first buffer layer BF1. For example, the lower metal layer BML may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include multiple inorganic layers alternately stacked on each other.

The thin film transistor TFT may be disposed on the second buffer layer BF2, and may constitute a pixel circuit of each of multiple pixels. For example, the thin film transistor TFT may be a switching transistor or a driving transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a portion of the semiconductor layer ACT, a material of the semiconductor layer ACT may be made into a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF to insulate the gate electrode GE from the semiconductor layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a pixel electrode AE of the light emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AE of the light emitting element ED passes.

The light emitting element layer EML may be disposed on the thin film transistor layer TFTL. The light emitting element layer EML may include the light emitting element ED and a pixel defining layer PDL. The light emitting element ED may include the pixel electrode AE, a light emitting layer EL, and a common electrode CE.

The pixel electrode AE may be disposed on the second passivation layer PAS2. The pixel electrode AE may be disposed to overlap any one of the openings OPE1, OPE2, and OPE3 of the pixel defining layer PDL. The pixel electrode AE may be electrically connected to the drain electrode DE of the thin film transistor TFT through the first and second connection electrodes CNE1 and CNE2.

The light emitting layer EL may be disposed on the pixel electrode AE. For example, the light emitting layer EL may be an organic light emitting layer made of an organic material, but is not limited thereto. In the case of employing the organic light emitting layer as the light emitting layer EL, the thin film transistor TFT applies a predetermined or selectable voltage to the pixel electrode AE of the light emitting element ED, and if the common electrode CE of the light emitting element ED receives a common voltage or a cathode voltage, the holes and electrons can move to the light emitting layer EL through the hole transport layer and the electron transport layer and combine to produce light to be emitted by the light emitting layer EL.

The common electrode CE may be arranged on the light emitting layer EL. For example, the common electrode CE may be made in the form of an electrode common to all of the pixels rather than specific to each of the pixels. The common electrode CE may be disposed on the light emitting layer EL in the first to third emission areas EA1, EA2, and EA3, and may be disposed on the pixel defining layer PDL in an area other than the first to third emission areas EA1, EA2, and EA3.

The common electrode CE may receive the common voltage or a low potential voltage. In case that the pixel electrode AE receives a voltage corresponding to a data voltage and the common electrode CE receives the low potential voltage, a potential difference is formed between the pixel electrode AE and the common electrode CE, so that the light emitting layer EL may emit light.

The pixel defining layer PDL may include the concave portions EB and the openings OPE1, OPE2, and OPE3, and may be disposed on a portion of the second passivation layer PAS2 and the pixel electrode AE.

The pixel defining layer PDL may include the first opening OPE1, the second opening OPE2, and the third opening OPE3, and each of the openings OPE1, OPE2, and OPE3 may expose a portion of the pixel electrode AE. As described above, each of the openings OPE1, OPE2, and OPE3 of the pixel defining layer PDL may define the first to third emission areas EA1, EA2, and EA3, and the areas or sizes of the openings OPE1, OPE2, and OPE3 may be different. The pixel defining layer PDL may separate and insulate the pixel electrode AE of each of the light emitting elements ED.

The pixel defining layer PDL may include a first portion overlapping the light blocking layer BM to be described later in the thickness direction and a second portion not overlapping the light blocking layer BM in the thickness direction.

Specifically, the first portion of the pixel defining layer PDL may mean an area of the pixel defining layer PDL overlapping the light blocking layer BM in the thickness direction, and the second portion may be the exposed areas ER1, ER2, and ER3 of the pixel defining layer PDL exposed by the holes OPT1, OPT2, and OPTS of the light blocking layer BM as described above.

More specifically, the first portion of the pixel defining layer PDL may include a top surface of the pixel defining layer PDL extending parallel to the substrate SUB. The second portion of the pixel defining layer PDL may be connected to the first portion and include the top surface of the pixel defining layer PDL extending parallel to the substrate SUB and the side surface connected to the top surface of the second portion of the pixel defining layer PDL. The side surface of the second portion of the pixel defining layer PDL may be an inclined surface. The side surface of the second portion of the pixel defining layer PDL may be the sidewalls of the openings OPE1, OPE2, and OPE3 of the pixel defining layer PDL.

The second portion of the pixel defining layer PDL may include the concave portions EB. Accordingly, the concave portions EB may not overlap the light blocking layer BM positioned on the upper portion of the pixel defining layer PDL in the thickness direction. Specifically, the concave portions EB may be disposed on the top surface of the second portion of the pixel defining layer PDL. The concave portion EB may be recessed from the top surface of the second portion of the pixel defining layer PDL toward (in) the thickness direction of the second portion of the pixel defining layer PDL, and may have a semicircular shape in cross-sectional view. For example, the concave portion EB may be recessed from the top surface of the second portion of the pixel defining layer PDL toward the substrate SUB direction. However, the shape of the concave portions EB in cross-sectional view is not limited to a semicircular shape. In some embodiments, the concave portion EB may have a shape in cross-sectional view in which the width of the concave portion EB decreases or increases while the concave portion EB is recessed toward the substrate SUB.

The pixel defining layer PDL may include a light absorbing material to prevent light reflection. For example, the pixel defining layer PDL may include a polyimide (PI)-based binder and a pigment in which red, green, and blue colors are mixed. In another embodiment, the pixel defining layer PDL may include a cardo-based binder resin and a mixture of a lactam black pigment and a blue pigment. In another embodiment, the pixel defining layer PDL may include carbon black.

As described above, the pixel defining layer PDL may include the concave portions EB, so that the top surface of the pixel defining layer PDL may have a concave-convex pattern, and thus the diffraction dispersion of the reflected light by the external light may increase. Accordingly, it may be possible to prevent the pattern due to the diffraction of the reflected light from being recognized as unevenness, it may be possible to provide a comfortable feeling of use although the user's use is outdoors in strong external light, and the screen displayed by the display device 10 may be viewed more clearly.

The encapsulation layer TFEL may be disposed on the common electrode CE to cover the light emitting elements ED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

In an embodiment, the encapsulation layer TFEL may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the organic encapsulation layer 320 may include an acrylic resin, for example, polymethyl methacrylate, polyacrylic acid, and/or the like. The second encapsulation layer TFE2 may be formed by curing a monomer or applying a polymer.

The light blocking layer BM may be disposed on the encapsulation layer TFEL. The light blocking layer BM may include the holes OPT1, OPT2, and OPT3 disposed to overlap the emission areas EA1, EA2, and EA3. For example, the first hole OPT1 may be disposed to overlap the first emission area EA1 or the first opening OPE1. The second hole OPT2 may be disposed to overlap the second emission area EA2 or the second opening OPE2, and the third hole OPT3 may be disposed to overlap the third emission area EA3 or the third opening OPE3. The area or size of each of the holes OPT1, OPT2, and OPT3 may be larger than the area or size of the openings OPE1, OPE2, and OPE3 of the pixel defining layer PDL. The holes OPT1, OPT2, and OPT3 of the light blocking layer BM are formed to be larger than the openings OPE1, OPE2, and OPE3 of the pixel defining layer PDL, so that the light emitted from the emission areas EA1, EA2, and EA3 may be visually recognized by the user not only from the front surface but also from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black, but they are not limited thereto. The light blocking layer BM may prevent visible light infiltration and color mixture between the first to third emission areas EA1, EA2, and EA3, which leads to the improvement of color reproducibility of the display device 10.

The color filters CF1, CF2, and CF3 of the color filter layer CFL may be disposed on the light blocking layer BM. The different color filters CF1, CF2, and CF3 may be disposed to correspond to the different emission areas EA1, EA2, and EA3 or openings OPE1, OPE2, and OPE3, and the holes OPT1, OPT2, and OPT3 of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first hole OPT1 of the light blocking layer BM, the second color filter CF2 may be disposed in the second hole OPT2 of the light blocking layer BM, and the third color filter CF3 may be disposed in the third hole OPT3 of the light blocking layer BM. Each of the color filters CF1, CF2, and CF3 may be disposed to have a larger area in plan view than the holes OPT1, OPT2, and OPT3 of the light blocking layer BM, and some may be disposed directly on the light blocking layer BM.

The planarization layer OC may be disposed on the color filters CF1, CF2, and CF3 to planarize the upper ends of the color filters CF1, CF2, and CF3. The planarization layer OC may be a colorless light-transmitting layer that does not have a color in the visible light band. For example, the planarization layer OC may include a colorless light-transmitting organic material such as an acrylic resin.

According to an embodiment, the color filters CF1, CF2, and CF3 of the display device 10 may be disposed to overlap other color filters CF1, CF2, and CF3 adjacent to each other on the light blocking layer BM. The color filters CF1, CF2, and CF3 disposed on the light blocking layer BM may be disposed such that the two color filters CF1, CF2, and CF3 adjacent to each other completely cover the light blocking layer BM. The two adjacent color filters CF1, CF2, and CF3 may be disposed to partially overlap each other on the light blocking layer BM. The overlapping disposition of the color filters CF1, CF2, and CF3 may be designed such that the overlapping of the color filters CF1, CF2, and CF3 further reduces the reflection of external light by the light blocking layer BM.

In the display device 10, the first color filter CF1 and the second color filter CF2 adjacent to each other may be disposed to overlap each other on the light blocking layer BM, and the second color filter CF2 and the third color filter CF3 may also be disposed to overlap each other on the light blocking layer BM. The first color filter CF1 and the third color filter CF3 adjacent to each other may also be disposed to overlap each other on the light blocking layer BM.

According to an embodiment, in the display device 10, the second color filter CF2 that is a green color filter may be disposed above the first color filter CF1 that is a red color filter and the third color filter CF3 that is a blue color filter. The third color filter CF3 that is a blue color filter may be disposed above the first color filter CF1 that is a red color filter. In the manufacturing process of the display device 10, the color filters CF1, CF2, and CF3 may be formed using a photoresist process, and the process sequence for forming the color filters CF1, CF2, and CF3 may be performed in the order of the first color filter CF1, the third color filter CF3, and the second color filter CF2. However, the disclosure is not limited thereto, and in another embodiment, the first color filter CF1 that is a red color filter may also be disposed on the second color filter CF2 and the third color filter CF3. The process sequence for forming the color filters CF1, CF2, and CF3 may be performed in the order of the second color filter CF2, the third color filter CF3, and the first color filter CF1.

Although the light blocking layer BM may include a material that absorbs light, some of the light incident from the outside may also be reflected by the light blocking layer BM. A portion of the color filters CF1, CF2, and CF3 disposed in the holes OPT1, OPT2, and OPT3 of the light blocking layer BM may be disposed directly on the light blocking layer BM and may be disposed to completely cover the light blocking layer BM. The two adjacent color filters CF1, CF2, and CF3 may include different colorants and are disposed to overlap each other on the light blocking layer BM, so that the reflection of external light by the light blocking layer BM may be reduced. However, the transmittance of the color filters CF1, CF2, and CF3 may vary according to the material forming the color filters CF1, CF2, and CF3, and the reflection due to external light may also be more effectively reduced according to the overlapping order of the color filters CF1, CF2, and CF3.

The reflection by the external light of the display device 10 may include reflection in the emission areas EA1, EA2, and EA3, reflection in the light transmitting area formed by the holes OPT1, OPT2, and OPT3 of the light blocking layer BM, and reflection in the light blocking layer BM. In case that the size of the openings OPE1, OPE2, and OPE3 of the pixel defining layer PDL, the size of the holes OPT1, OPT2, and OPT3 of the light blocking layer BM, and the spacing between the openings OPE1, OPE2, and OPE3 and the holes OPT1, OPT2, and OPT3 and the like are adjusted, it may be possible to control the reflection of external light in the emission areas EA1, EA2, and EA3 and the light transmitting area. However, in case that the above conditions are controlled, factors related to the light efficiency of the display device 10 such as the efficiency and lifespan of the light emitting element ED and side visibility of the display device 10 may also be affected. On the other hand, in case that the color filters CF1, CF2, and CF3 are disposed to be overlapped on the light blocking layer BM, the reflection of external light by the light blocking layer BM may be greatly reduced without affecting the light efficiency of the display device 10 described above.

By adjusting the area and thickness of the color filters CF1, CF2, and CF3 in plan view, the overlapping portion width of the different color filters CF1, CF2, and CF3, and the like, the color of the reflected light may be controlled to a color that gives convenience to the user. For example, as the reflected light by external light, the color of the reflected light in the emission areas EA1, EA2, and EA3 and the light transmitting area may be controlled according to the area of the color filters CF1, CF2, and CF3, and the reflected light in the light blocking layer BM may vary depending on the area, width, and the like of the overlapping portion of the color filters CF1, CF2, and CF3.

Accordingly, as described above, a display device 10 according to an embodiment may include the concave portions EB in the exposed areas ER1, ER2, and ER3 of the pixel defining layer PDL that may not overlap the light blocking layer BM, so that the pixel defining layer PDL may partially include a concave-convex pattern. Accordingly, light reflected from each of the concave portions EB included in the pixel defining layer PDL may be reflected in a random direction instead of being reflected in a predetermined or selectable direction, and the interfered light may be viewed in a random pattern. Although a concave-convex pattern may be formed by the concave portion EB included in the pixel defining layer PDL, the interference of the reflected light may not be strong, so that the pattern of the reflected light may not cause inconvenience to the user.

Hereinafter, the concave portions EB disposed in the exposed areas ER1, ER2, and ER3 of the pixel defining layer PDL will be described with reference to other drawings.

Figure 8:
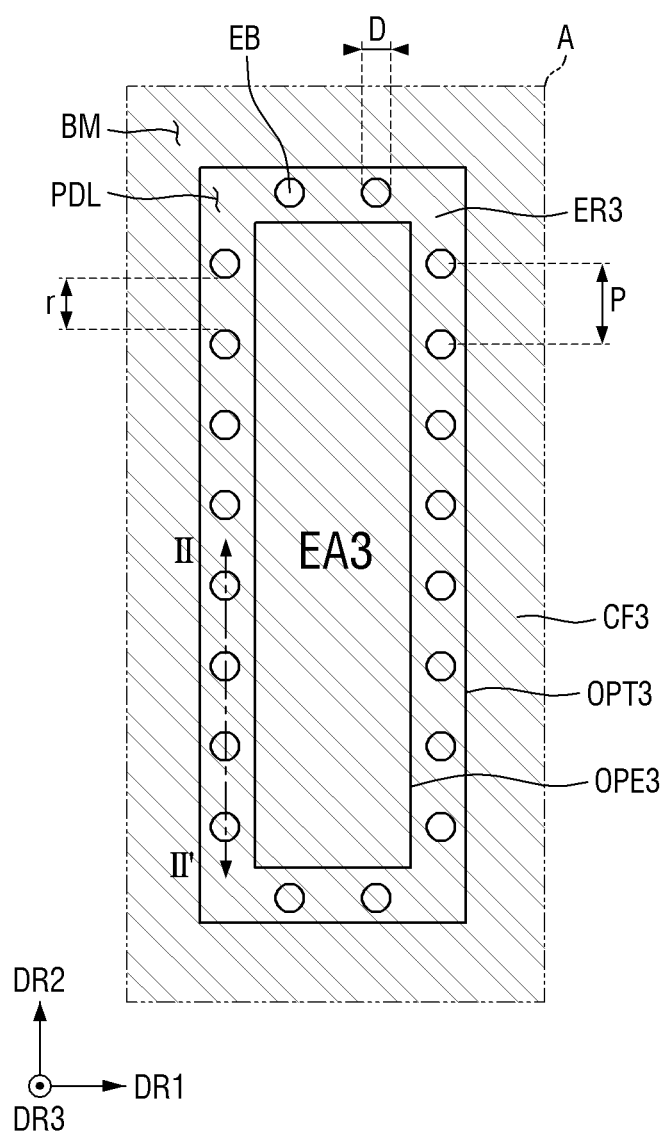
FIG. 8 is an enlarged schematic view of area A of FIG. 6.
Figure 9:
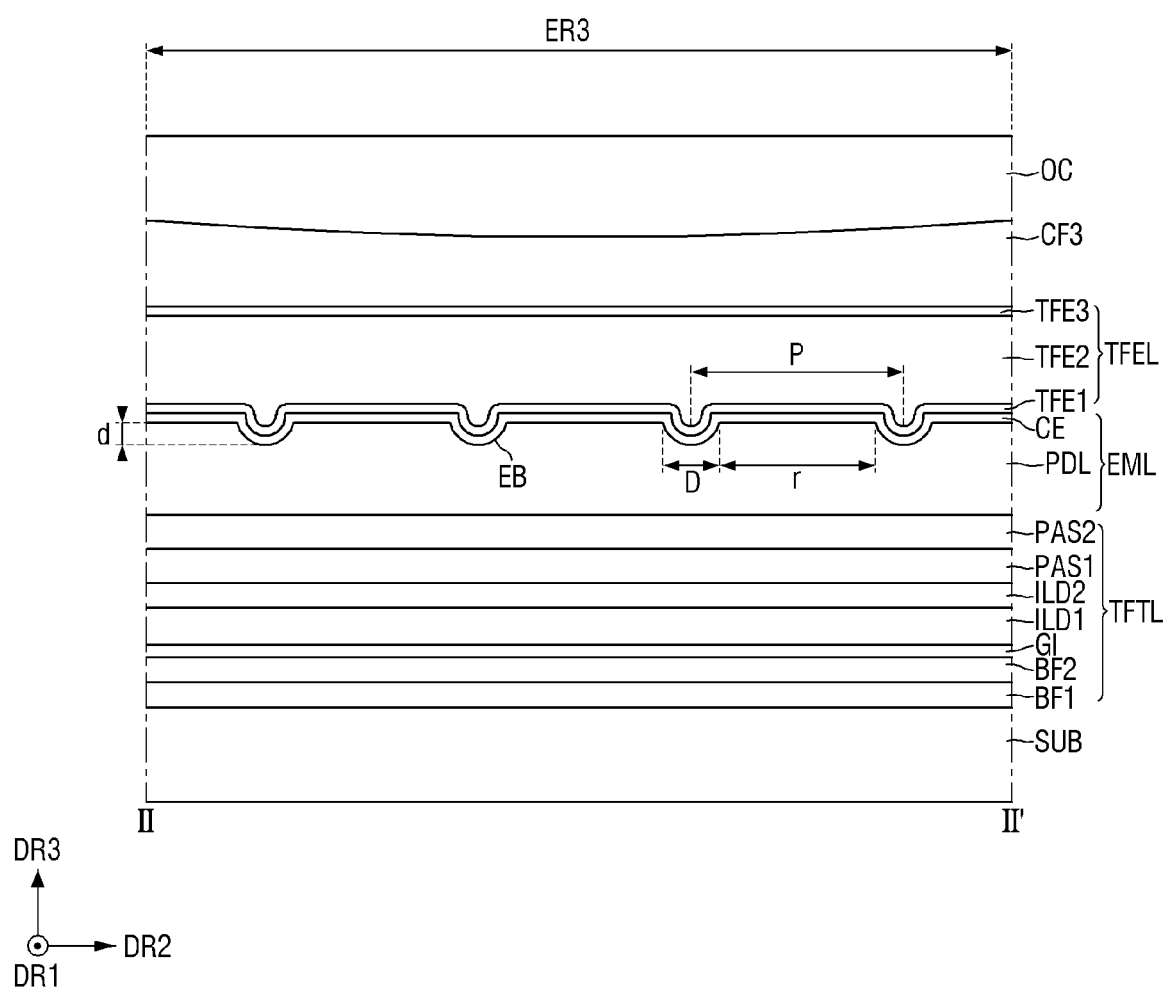
FIG. 9 is a schematic cross-sectional view taken along line II-IT of FIG. 8.

FIG. 8 is an enlarged schematic view of area A of FIG. 6. FIG. 9 is a schematic cross-sectional view taken along line II-IT of FIG. 8.

Specifically, FIG. 9 illustrates a cross section crossing the concave portions EB disposed in the second direction DR2. In FIGS. 8 and 9, the content overlapping with the above description will be omitted, and the concave portion EB and the disposition relationship between the concave portions EB will be described.

As illustrated in FIG. 8, the concave portions EB may surround the third opening OPE3 including a short side extending in the first direction DR1 and a long side extending in the second direction DR2, and may be disposed in the third exposed area ER3 of the pixel defining layer PDL. The number of concave portions EB disposed adjacent to the short side of the third opening OPE3 may be less than the number of concave portions EB disposed adjacent to the long side of the third opening OPE3.

A diameter D and a depth d of each of the concave portions EB may vary depending on a mask pattern used in a photoresist process for patterning the pixel defining layer PDL. For example, the pattern of the mask used in the patterning process of forming the pixel defining layer PDL may have a mask width corresponding to the fact that the pixel defining layer PDL includes the concave portions EB recessed in the thickness direction. In other words, as the width of the mask pattern corresponding to the position at which the concave portions EB included in the pixel defining layer PDL are formed increases, the diameter D of the concave portion EB may increase. The diameter D of the concave portion EB and the depth d of the concave portion EB recessed in the thickness direction may have a correlation. For example, as the diameter D of the concave portion EB increases, the depth d of the concave portion EB in the thickness direction may become deeper, and as the diameter D decreases, the depth d may become shallower.

As described above, the concave portion EB may be formed by a photoresist process using a mask, so that the diameter D and the depth d of each of the concave portions EB may be affected also by the resolution limit of the photoresist process.

Referring to FIG. 9 in addition to FIG. 8, in an embodiment, the width of the mask pattern corresponding to the concave portions EB among the patterns of the mask used in the photoresist process for patterning the pixel defining layer PDL may be equal to about 3 µm or less. As described above, the concave portion EB may be formed using a mask having a width of about 3 µm or less, so that each of the diameters D of the concave portions EB may have a range of about 3 µm to about 5 µm, and each of the depths d of the concave portions EB may have a range of about 0.3 µm to about 0.5 µm. A detailed description thereof will be described later along with a method of manufacturing the display device 10 to be described later.

In case that the diameters D and the depths d of the concave portions EB have the numerical ranges described above, respectively, the diffraction of the reflected light by external light may be effectively dispersed, and in case that the resolution limit of the photoresist process is considered, a decrease in resolution of the display device 10 may be prevented. The depth of the concave portion EB recessed from the surface of the pixel defining layer PDL toward the thickness direction of the pixel defining layer PDL may be obtained without exposing the layers disposed under the pixel defining layer PDL.

Referring back to FIGS. 8 and 9, a spacing r between the concave portions EB surrounding the short side of the third opening OPE3 extending in the first direction DR1 and the long side of the third opening OPE3 extending in the second direction DR2 and each disposed in the first direction DR1 and the second direction DR2, may have a range of about 3 µm to about 7 µm. Here, the spacing r between the concave portions EB may be the minimum distance between the adjacent concave portions EB.

A spacing P between the centers of the concave portions EB may have a range of about 5 µm to about 7 µm. Here, the spacing P between the centers of the concave portions EB may be the distance sum of the spacing r between the adjacent concave portions EB and the diameter D of the concave portion EB.

In case that the spacing r between the concave portions EB and the spacing P between the centers of the concave portions EB have the numerical ranges described above, as described above, the diffraction dispersion of the reflected light may be increased, and a decrease in resolution of the display device 10 may be prevented.

However, the diameter D and depth d of each of the concave portions EB, the spacing r between the concave portions EB, and the spacing P between the centers of the concave portions EB are not limited to the numerical ranges described above. The spacing r between the concave portions EB and the spacing P between the centers of the concave portions EB may vary depending on the diameter D and the depth d of each of the concave portions EB described above, and thus in case that the numerical ranges of the diameter D and the depth d of each of the concave portions EB described above may be different, the spacing r between the concave portions EB and the spacing P between the centers of the concave portions EB may also be different. For example, the spacing r between the concave portions EB and the spacing P between the centers of the concave portions EB may have a correlation with the diameter D and the depth d of each of the concave portions EB.

The diameter D and depth d of each of the concave portions EB, the spacing r between the concave portions EB, and the spacing P between the centers of the concave portions EB may vary depending on the patterning process condition of the pixel defining layer PDL. For example, in a patterning process using a mask, conditions such as a thickness of the pixel defining layer PDL, an exposure amount, and a development time may vary.

In FIGS. 8 and 9, the concave portions EB surrounding the third opening OPE3 have been described, but the above-described contents may be applied also to the concave portions EB surrounding the first opening OPE1 and the second opening OPE2.

In case that the display device 10 may disperse the diffraction of the reflected light by external light, the position and arrangement of the concave portions EB included in the pixel defining layer PDL may be variously modified. Hereinafter, other embodiments of the display device 10 will be described. In the following embodiments, description of the same components as those of the above-described embodiments, which are denoted by like reference numerals, will be omitted or simplified, and differences will be described.

Figure 10:
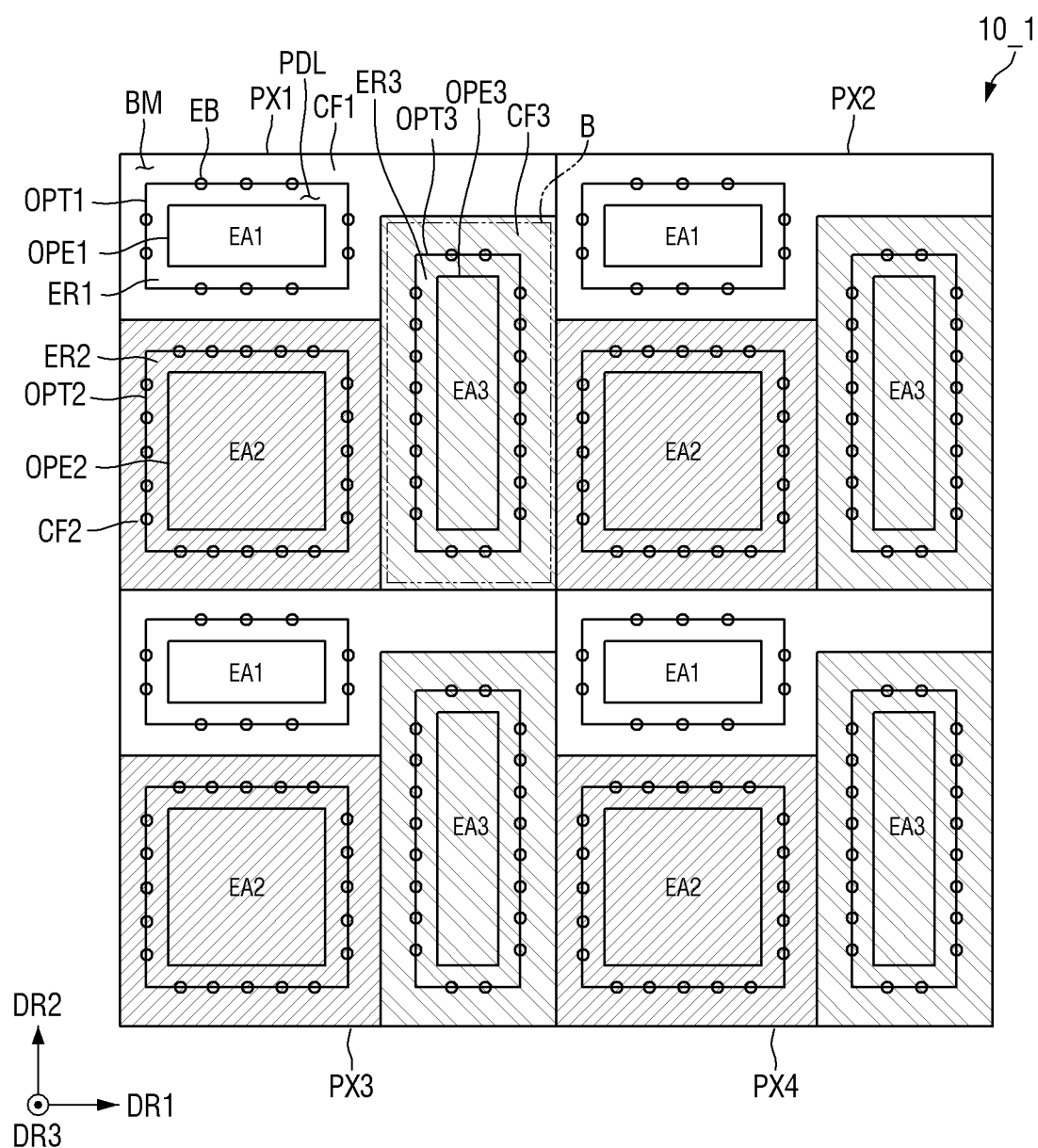
FIG. 10 is a schematic plan view illustrating a disposition of color filters disposed in a display area of a display device according to another embodiment.
Figure 11:
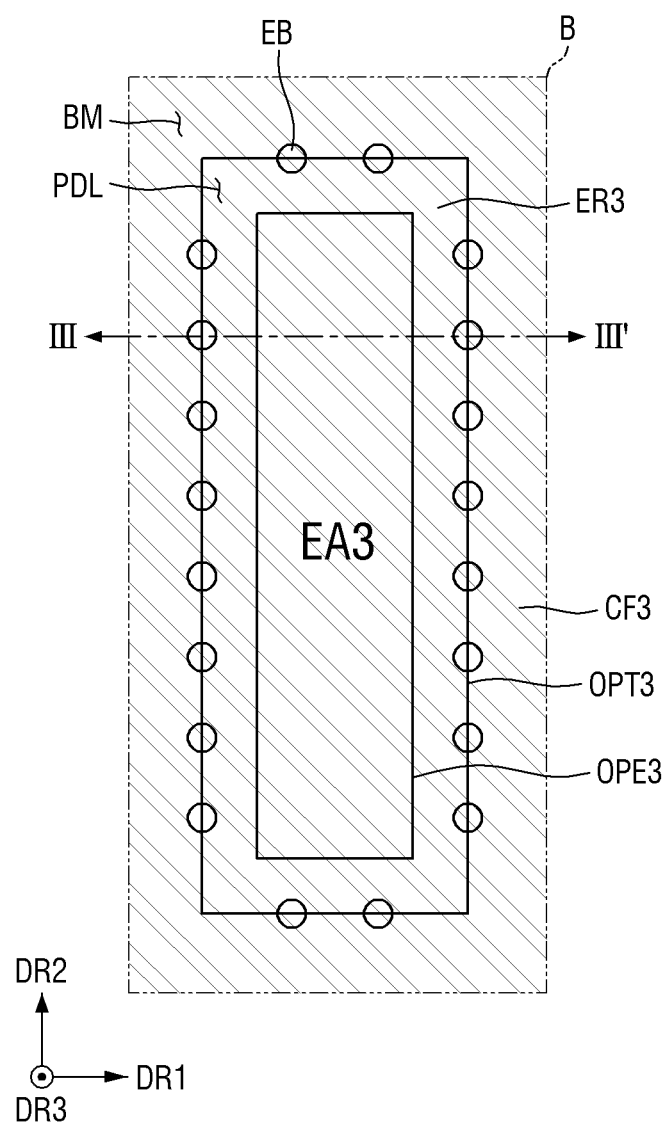
FIG. 11 is an enlarged schematic view of area B of FIG. 10.
Figure 12:
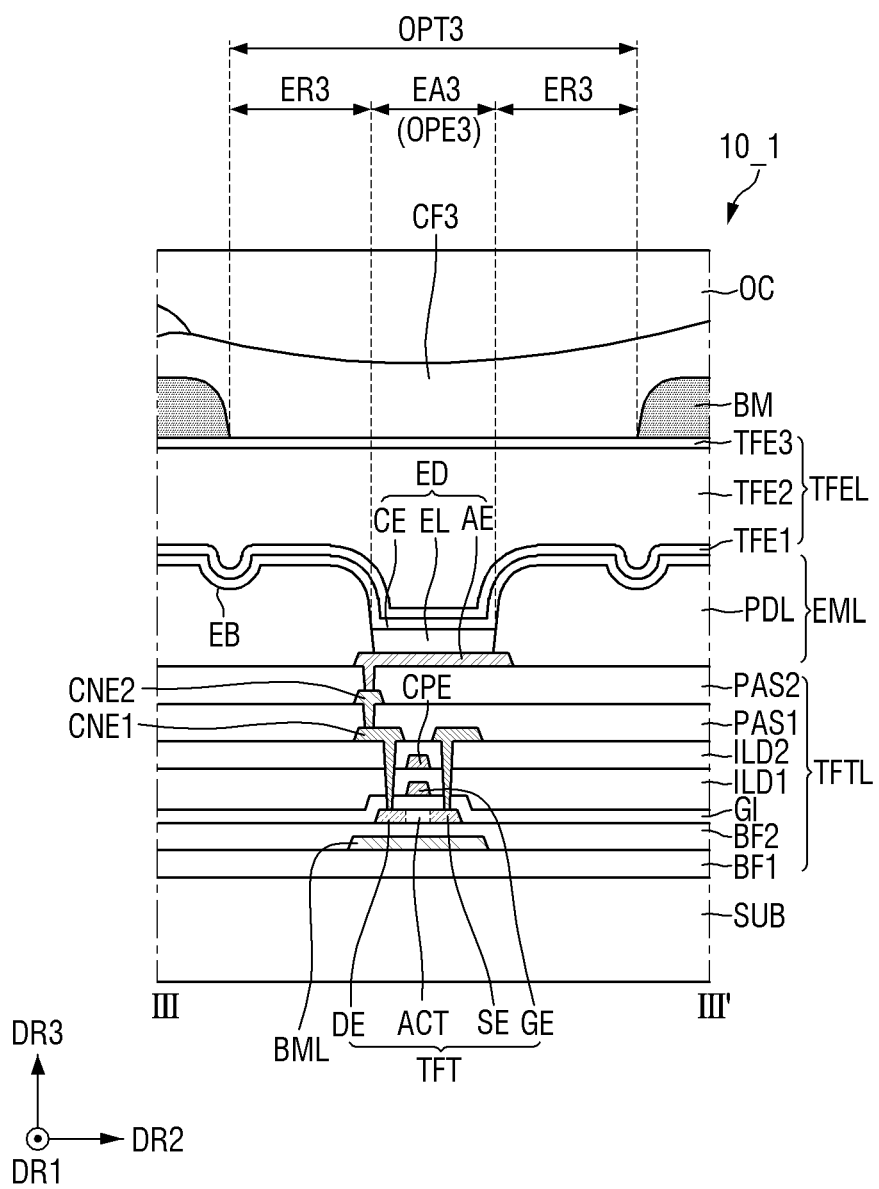
FIG. 12 is a schematic cross-sectional view taken along line III-III' of FIG. 11.

FIG. 10 is a schematic plan view illustrating a disposition of color filters disposed in a display area of a display device according to another embodiment. FIG. 11 is an enlarged schematic view of area B of FIG. 10. FIG. 12 is a schematic cross-sectional view taken along line III-III' of FIG. 11.

A display device 10_1 according to an embodiment illustrated in FIGS. 10 to 12 may be different from the display device 10 according to embodiments illustrated in FIGS. 6 to 8 at least in that in the pixels PX1, PX2, PX3, and PX4, the concave portions EB disposed in the exposed areas ER1, ER2, and ER3 of the pixel defining layer PDL may overlap a portion of the light blocking layer BM in the thickness direction.

Specifically, referring to FIGS. 10 and 11, there may be a difference in that the concave portions EB disposed in the exposed areas ER1, ER2, and ER3 of the pixel defining layer PDL exposed by the holes OPT1, OPT2, and OPT3 of the light blocking layer BM according to an embodiment may be disposed to be further spaced apart from the side edges of the openings OPE1, OPE2, and OPE3 to the side edges of the holes OPT1, OPT2, and OPT3, as compared with the concave portions EB disposed in the exposed areas ER1, ER2, and ER3 according to an embodiment illustrated in FIGS. 6 to 8.

Accordingly, a portion of the area of the concave portion EB disposed in the exposed areas ER1, ER2, and ER3 of the pixel defining layer PDL may overlap the light blocking layer BM. For example, a portion of the area of the concave portion EB may overlap a portion of the light blocking layer BM in the thickness direction, and a portion of the area of the concave portion EB that does not overlap the light blocking layer BM may be exposed.

Referring to FIG. 12 in addition to FIGS. 10 and 11, in an embodiment, the concave portions EB may be positioned at the boundary between the first portion and the second portion of the pixel defining layer PDL described above. For example, the concave portion EB may be positioned over the top surface of the first portion and the top surface of the second portion of the pixel defining layer PDL. In other words, as the concave portion EB may be positioned at the boundary between the first portion and the second portion of the pixel defining layer PDL, a portion of the concave portion EB may be positioned in the first portion and the remaining portion of the concave portion EB may be positioned in the second portion.

Specifically, a portion of the concave portion EB positioned in the first portion of the pixel defining layer PDL may overlap the light blocking layer BM positioned above the pixel defining layer PDL, and a portion of the concave portion EB positioned in the second portion of the pixel defining layer PDL may not overlap the light blocking layer BM and may be exposed.

In the display device 10_1 according to an embodiment, although a portion of the area of the concave portion EB included in the pixel defining layer PDL may overlap the light blocking layer BM, the diffraction of the reflected light by external light may be dispersed by the remaining area of the concave portion EB that does not overlap the light blocking layer BM.

Figure 13:
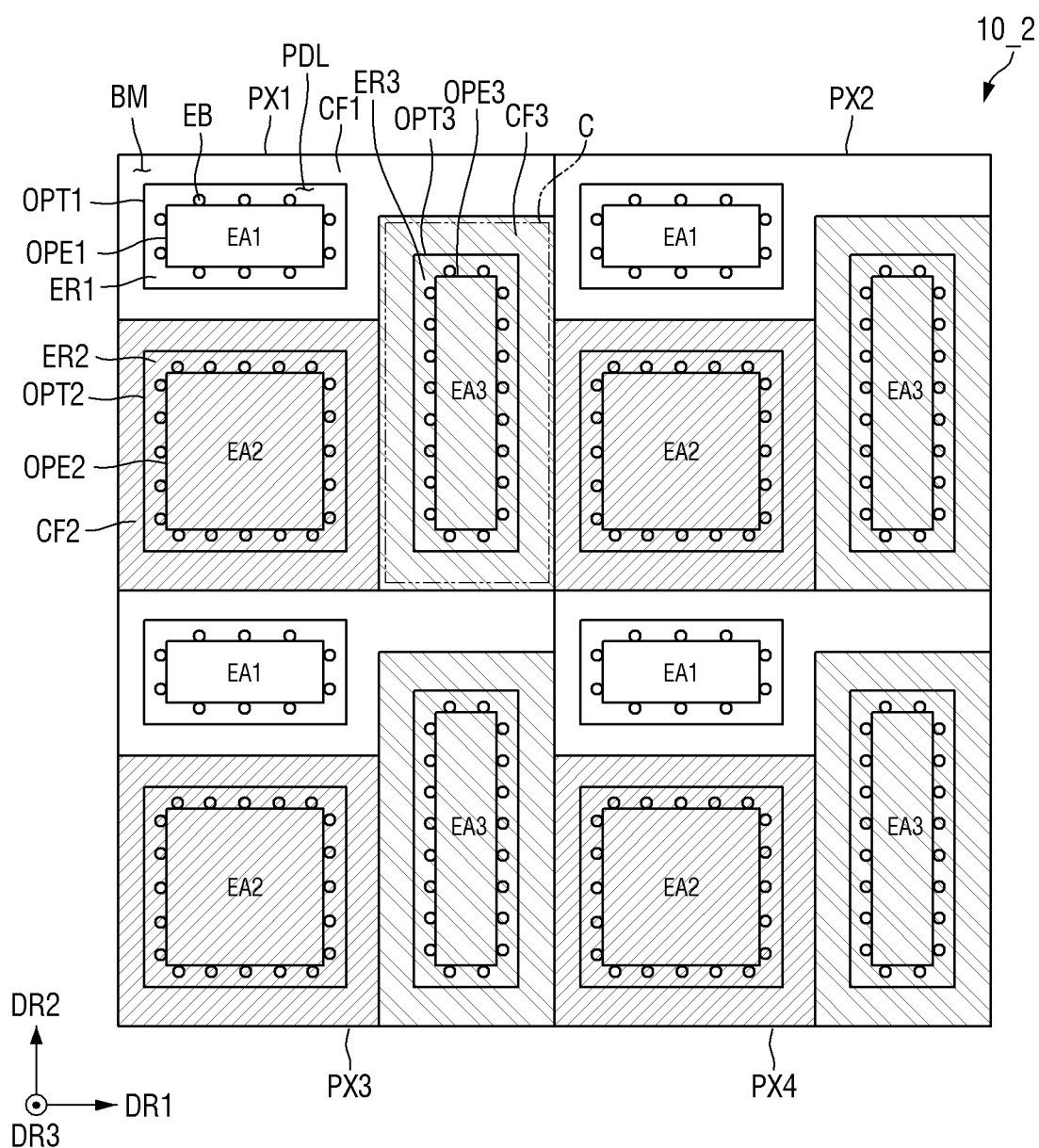
FIG. 13 is a schematic plan view illustrating a disposition of color filters disposed in a display area of a display device according to still another embodiment.
Figure 14:
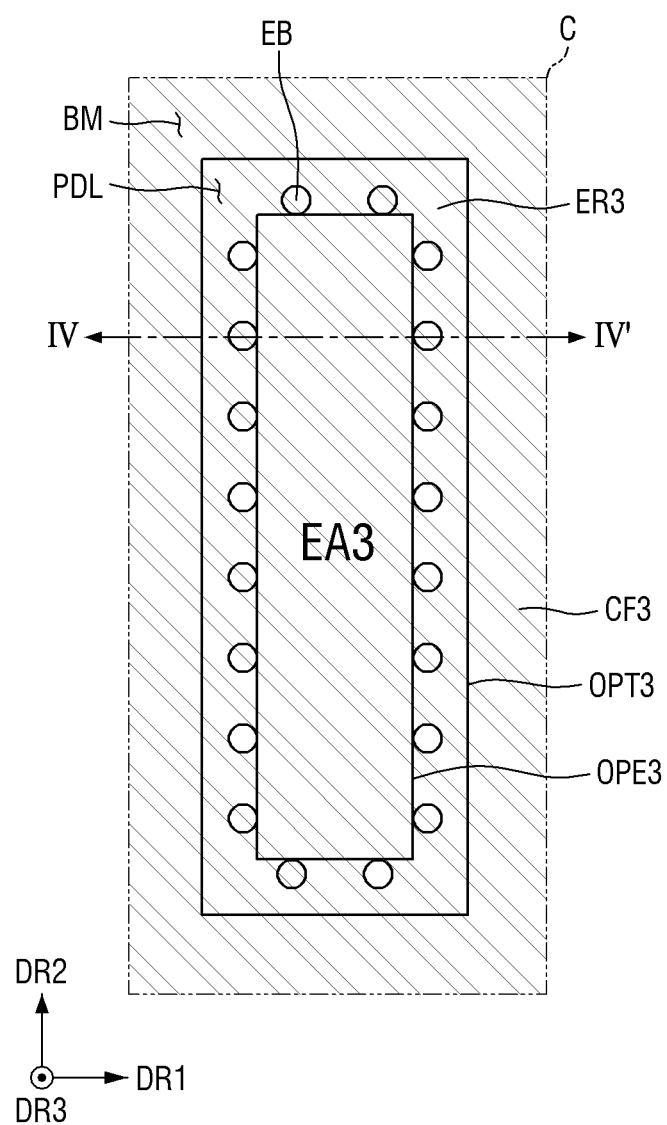
FIG. 14 is an enlarged schematic view of area C of FIG. 13.
Figure 15:
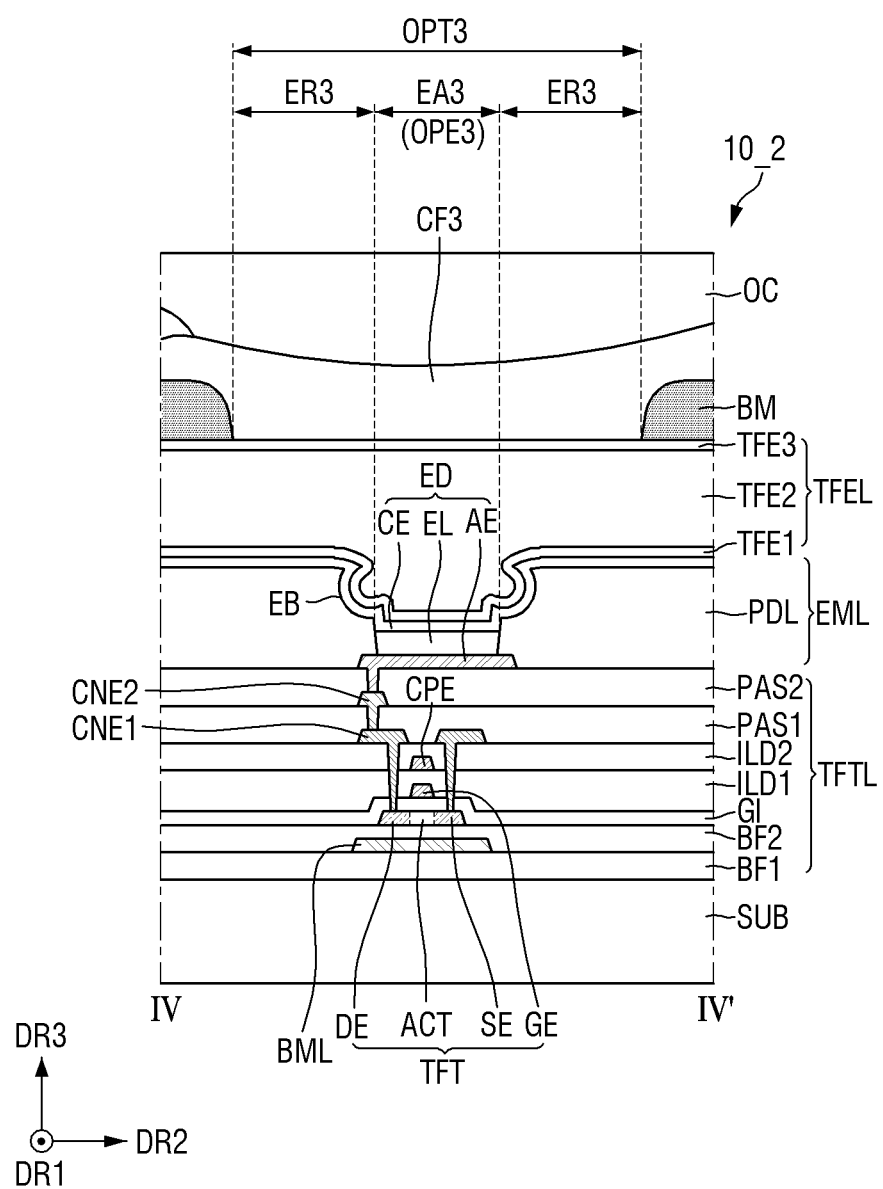
FIG. 15 is a schematic cross-sectional view taken along line IV-IV' of FIG. 14.

FIG. 13 is a schematic plan view illustrating a disposition of color filters disposed in a display area of a display device according to still another embodiment. FIG. 14 is an enlarged schematic view of area C of FIG. 13. FIG. 15 is a schematic cross-sectional view taken along line IV-IV' of FIG. 14.

The concave portions EB disposed in the exposed areas ER1, ER2, and ER3 of the pixel defining layer PDL exposed by the holes OPT1, OPT2, and OPTS of the light blocking layer BM according to an embodiment may be different from the concave portions EB disposed in the exposed areas ER1, ER2, and ER3 according to an embodiment illustrated in FIGS. 6 to 8 at least in that the concave portions EB may be disposed to be further adjacent to the side edges of the openings OPE1, OPE2, and OPE3 of the pixel defining layer PDL.

Specifically, referring to FIGS. 13 and 14, in an embodiment, unlike an embodiment illustrated in FIGS. 6 to 8, the concave portions EB disposed in the exposed areas ER1, ER2, and ER3 of the pixel defining layer PDL may be disposed to be further adjacent to the side edges of the openings OPE1, OPE2 and OPE3 of the pixel defining layer PDL, so that a distance between the concave portions EB and the side edges of the openings OPE1, OPE2, and OPE3 may be closer than a distance between the concave portions EB and the side edges of the holes OPT1, OPT2, and OPTS.

Referring to FIG. 15 in addition to FIGS. 13 and 14, in an embodiment, the concave portions EB may be positioned on the side surface of the second portion of the pixel defining layer PDL described above. For example, the concave portion EB may be positioned on the inclined surface of the pixel defining layer PDL. In other words, the concave portion EB may be positioned on the sidewalls of the third openings OPE3. The concave portion EB may be positioned on the side surface of the second portion of the pixel defining layer PDL, so that the concave portion EB may not overlap the light blocking layer BM positioned on the pixel defining layer PDL.

In FIG. 15, the third opening OPE3 is illustrated, but the concave portions EB may be disposed on the inclined surface of the pixel defining layer PDL corresponding to the sidewalls of the first opening OPE1 and the second opening OPE2.

In a display device 10_2 according to an embodiment, the concave portions EB may be positioned on the inclined surface of the pixel defining layer PDL, so that it may be possible to disperse the diffraction of the reflected light of external light by the common electrode CE positioned on the inclined surface of the pixel defining layer PDL. For example, as described above, the external light reflection ratio by the common electrode CE disposed along the inclined surface of the pixel defining layer PDL may be high, and thus the concave portion EB may be disposed on the inclined surface of the pixel defining layer PDL, so that the diffraction of the reflected light by external light may be effectively dispersed.

Figure 16:
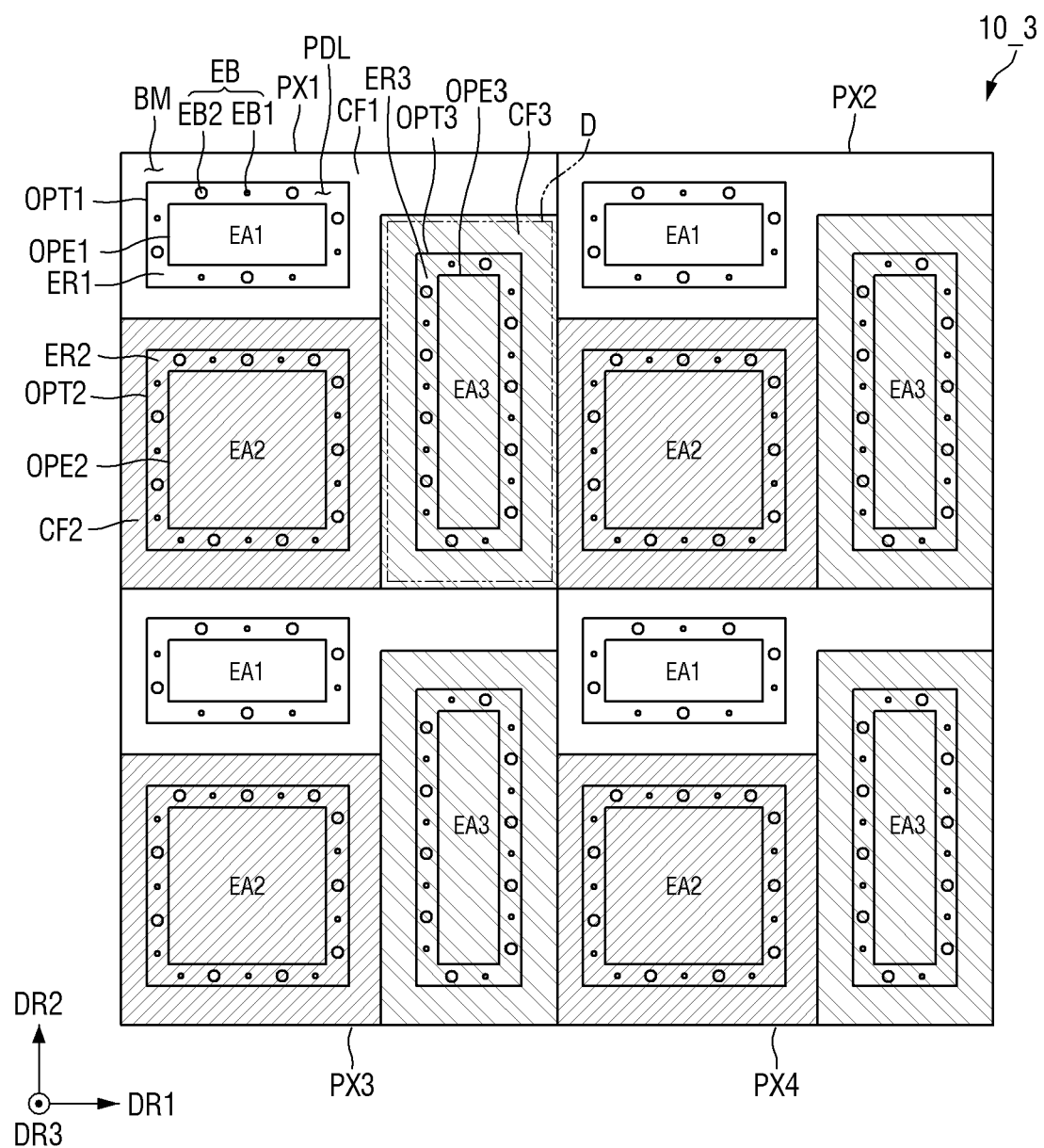
FIG. 16 is a schematic plan view illustrating a disposition of color filters disposed in a display area of a display device according to still another embodiment.
Figure 17:
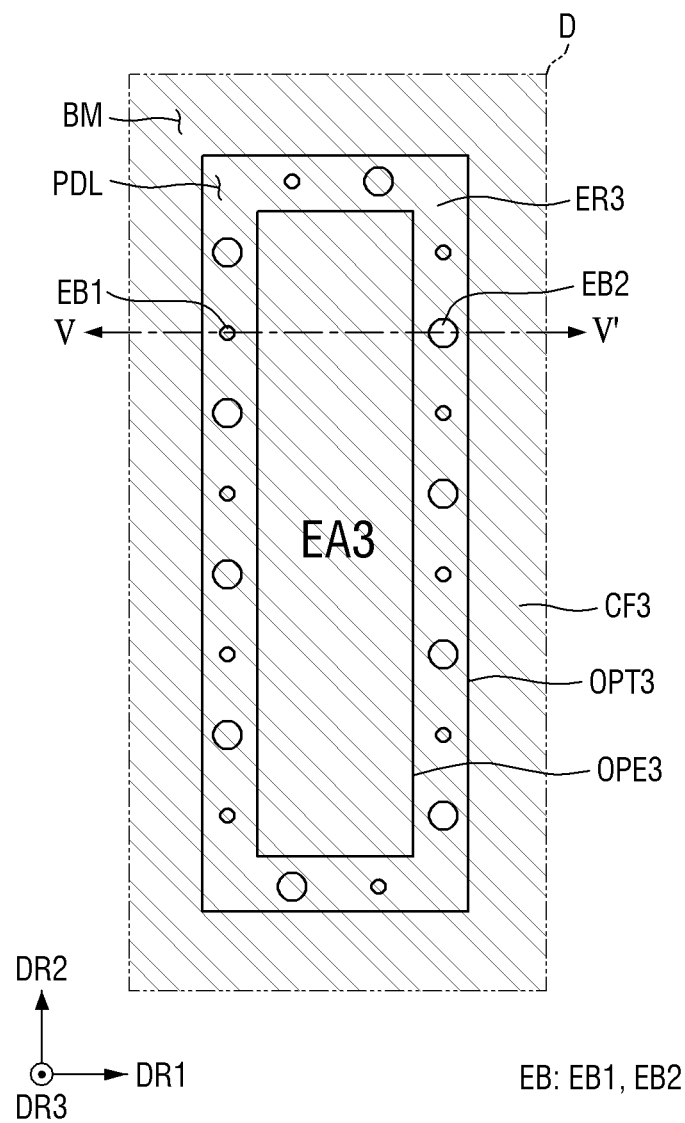
FIG. 17 is an enlarged schematic view of area D of FIG. 16.
Figure 18:
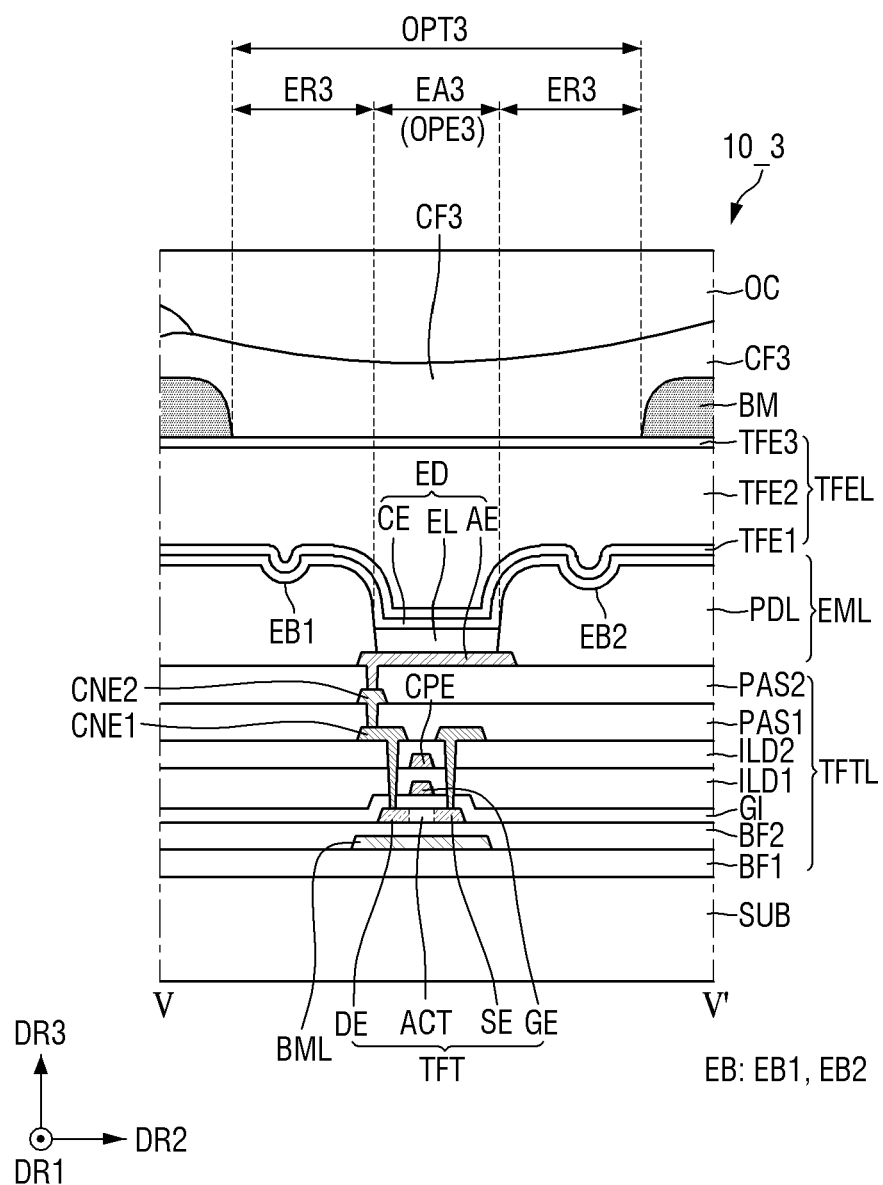
FIG. 18 is a schematic cross-sectional view taken along line V-V' of FIG. 17.

FIG. 16 is a schematic plan view illustrating a disposition of color filters disposed in a display area of a display device according to still another embodiment. FIG. 17 is an enlarged schematic view of area D of FIG. 16. FIG. 18 is a schematic cross-sectional view taken along line V-V' of FIG. 17.

A display device 10_3 according to an embodiment illustrated in FIGS. 16 to 18 may be different from the display device 10 according to an embodiment illustrated in FIGS. 6 to 8 at least in that the display device 10_3 may have the different sizes of the concave portions EB disposed in the exposed areas ER1, ER2, and ER3 of the pixel defining layer PDL exposed by the holes OPT1, OPT2, and OPT3 of the light blocking layer BM.

Referring to FIGS. 16 and 17, in an embodiment, unlike an embodiment illustrated in FIGS. 6 to 8, the concave portions EB disposed in the exposed areas ER1, ER2, and ER3 of the pixel defining layer PDL may include a first concave portion EB1 and a second concave portion EB2 having different diameters. In an embodiment, the diameter of the first concave portion EB1 and the diameter of the second concave portion EB2 may have a range of about 3 μm to about 5 μm as described above, and the diameter of the first concave portion EB1 may be smaller than the diameter of the second concave portion EB2.

The first concave portion EB1 and the second concave portion EB2 having different diameters and surrounding the openings OPE1, OPE2, and OPE3 may be alternately arranged. For example, as illustrated in FIG. 17, the first concave portion EB1 and the second concave portion EB2 may be disposed adjacent to the short side of the third opening OPE3 extending in the first direction DR1 may be alternately arranged in the first direction DR1, and the first concave portion EB1 and the second concave portion EB2 disposed adjacent to the long side of the third opening OPE3 extending in the second direction DR2 may be alternately arranged in the second direction DR2. For example, the first concave portions EB1 and the second concave portions EB2 having different diameters may be alternately disposed.

FIGS. 16 and 17 illustrate that the first concave portion EB1 and the second concave portion EB2 are alternately arranged, but the disclosure is not limited thereto. In some embodiments, the first concave portions EB1 and the second concave portions EB2 may be alternately disposed in a repeating unit. For example, a first group including at least two first concave portions EB1 and a second group including at least two second concave portions EB2 may be alternately arranged. In some embodiments, only one of the first concave portion EB1 and the second concave portion EB2 may be arranged in a repeating unit. For example, the first group including at least two first concave portions EB1 and the second concave portions EB2 may be alternately arranged.

Although the first concave portion EB1 and the second concave portion EB2 having different diameters are illustrated in an embodiment, embodiments are not limited thereto, and the concave portions EB having different diameters from the first concave portion EB1 and the second concave portion EB2 may be further included.

Referring to FIG. 18 in addition to FIGS. 16 and 17, in an embodiment, the first concave portions EB1 and the second concave portions EB2 having different diameters may be positioned on the top surface of the second portion of the pixel defining layer PDL described above. The first concave portion EB1 and the second concave portion EB2 may be disposed on the top surface of the second portion of the pixel defining layer PDL, and thus may not overlap the light blocking layer BM positioned on the pixel defining layer PDL.

The first concave portion EB1 and the second concave portion EB2 having different diameters may be disposed to be spaced apart from each other with the openings OPE1, OPE2, and OPE3 or the emission areas EA1, EA2, and EA3 therebetween. For example, as illustrated in FIG. 18, with the third opening OPE3 or the third emission area EA3 interposed therebetween, the first concave portion EB1 may be disposed on a side of the third opening OPE3 or the third emission area EA3, and the second concave portion EB2 may be disposed on another side of the third opening OPE3 or the third emission area EA3.

The depth of the first concave portion EB1 recessed from the top surface of the second portion of the pixel defining layer PDL toward the thickness direction of the second portion of the pixel defining layer PDL may be shallower than the depth of the second concave portion EB2 recessed from the top surface of the second portion of the pixel defining layer PDL toward the thickness direction of the second portion of the pixel defining layer PDL. As described above, according to the correlation between the diameter and the depth of the concave portion, the diameter of the first concave portion EB1 may be smaller than the diameter of the second concave portion EB2, so that the depth of the first concave portion EB1 may be shallower than the depth of the second concave portion EB2.

In the display device 10_3 according to an embodiment, the concave portions EB having different diameters may be positioned in the pixel defining layer PDL, so that, as compared with a case where the concave portions EB having the same size may be positioned in the pixel defining layer PDL, the light reflected from each of the concave portions EB may not be reflected in a predetermined or selectable direction but be reflected in a random direction and the dispersion of the diffraction of the reflected light of external light may be more efficiently carried out, and thus the visual recognition of the reflected light pattern may be reduced.

Figure 19:
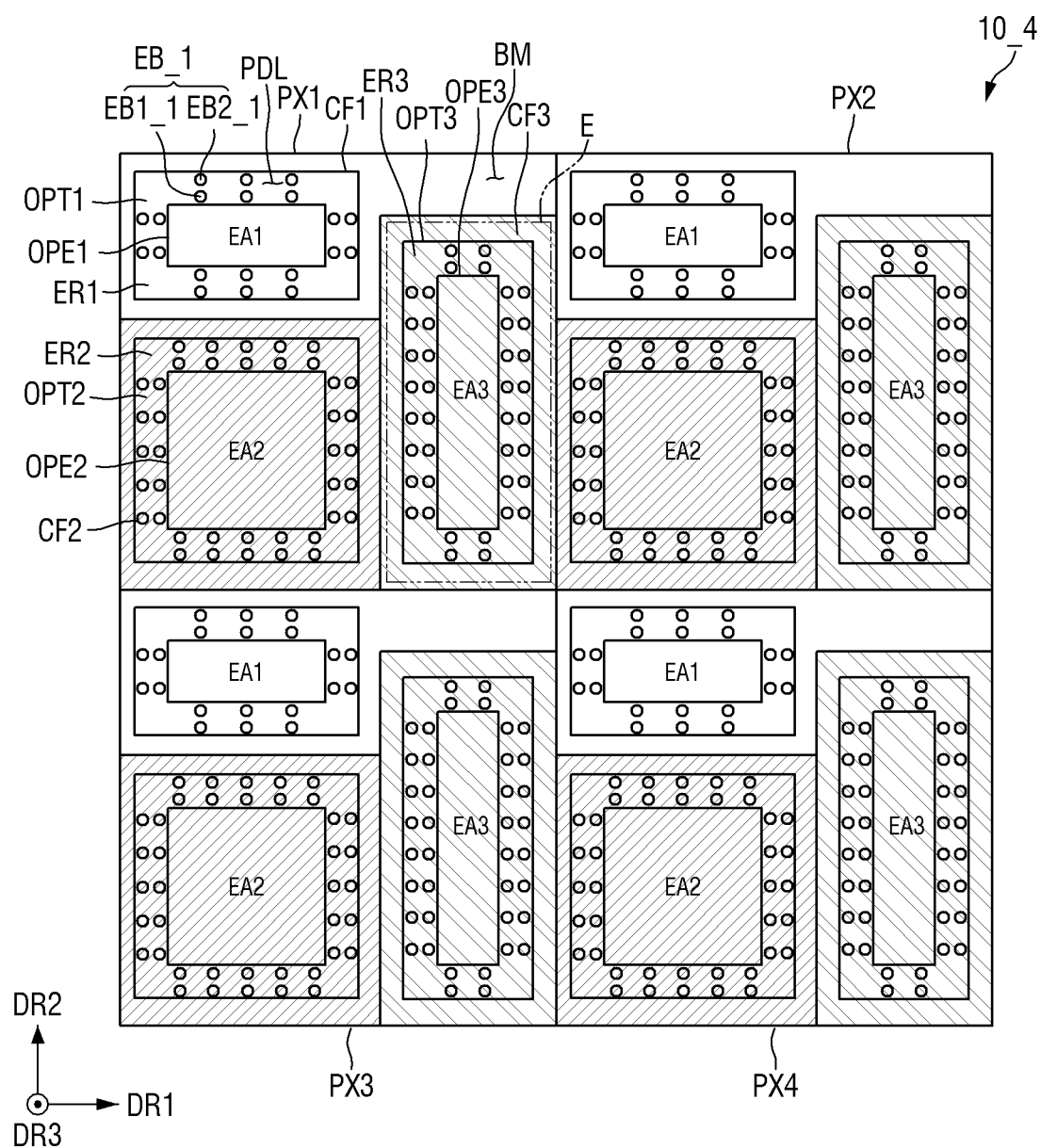
FIG. 19 is a schematic plan view illustrating a disposition of color filters disposed in a display area of a display device according to still another embodiment.
Figure 20:
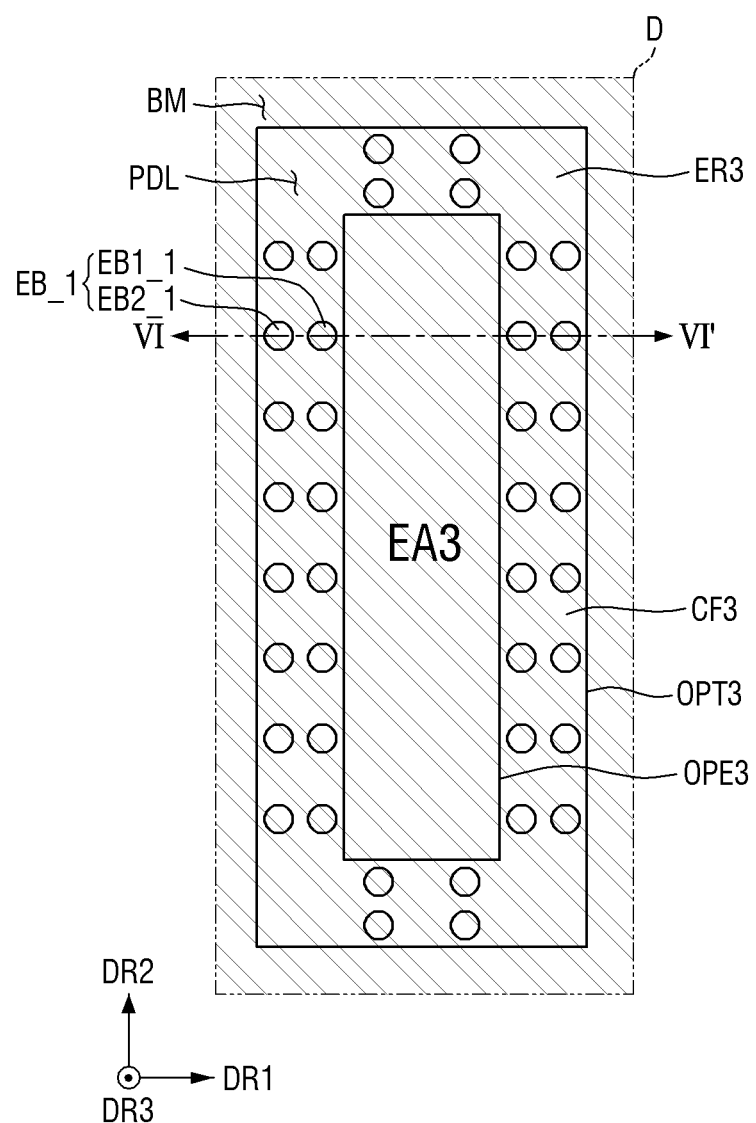
FIG. 20 is an enlarged schematic view of area E of FIG. 19.
Figure 21:
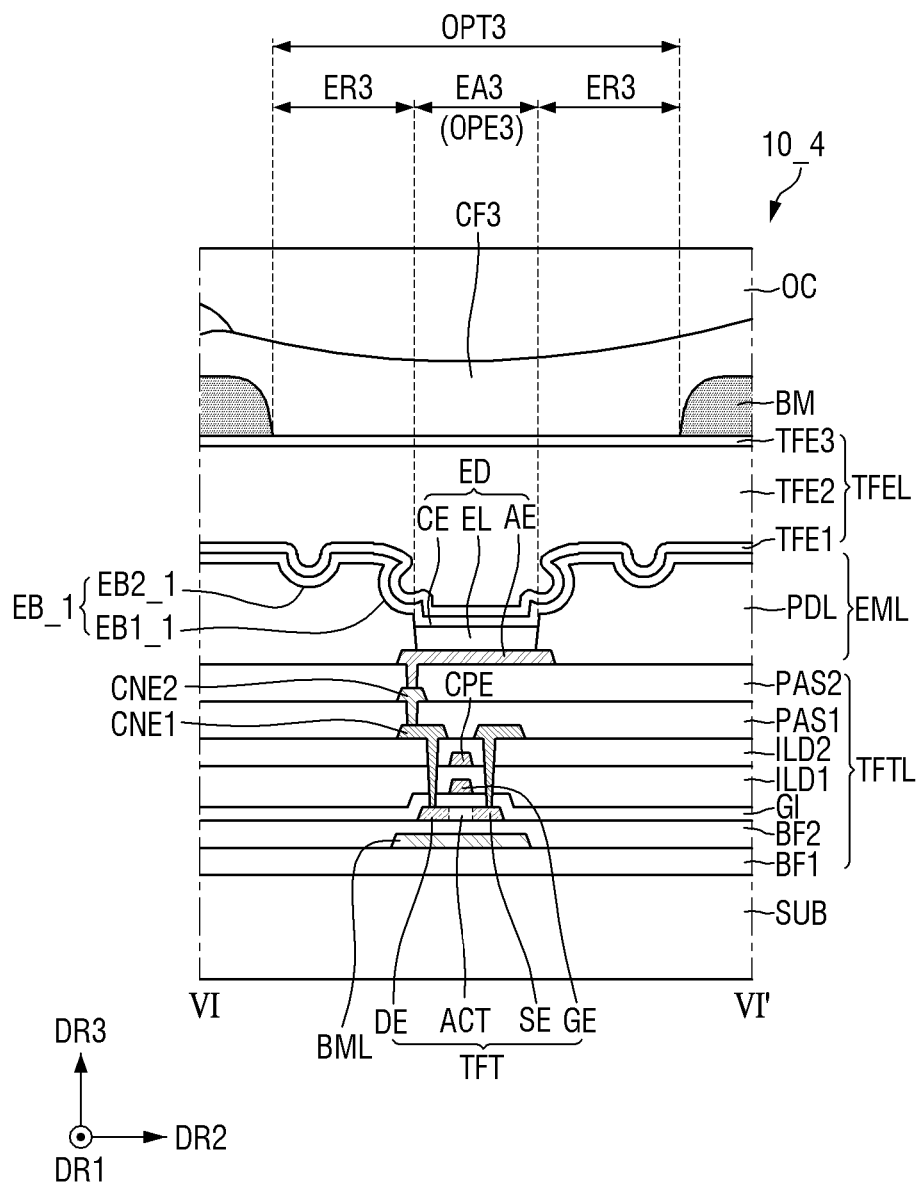
FIG. 21 is a schematic cross-sectional view taken along line VI-VI' of FIG. 20.

FIG. 19 is a schematic plan view illustrating a disposition of color filters disposed in a display area of a display device according to still another embodiment. FIG. 20 is an enlarged schematic view of area E of FIG. 19. FIG. 21 is a schematic cross-sectional view taken along line VI-VI' of FIG. 20.

A display device 10_4 according to an embodiment illustrated in FIGS. 19 to 21 may be different from the display device 10 according to an embodiment illustrated in FIGS. 6 to 8 at least in that the number and arrangement of concave portions EB_1 disposed in the exposed areas ER1, ER2, and ER3 of the pixel defining layer PDL exposed by the holes OPT1, OPT2, and OPT3 of the light blocking layer BM may be different.

Specifically, referring to FIGS. 19 and 20, in an embodiment, unlike an embodiment illustrated in FIGS. 6 to 8, the first concave portions EB1_1 disposed to surround the side edges of the openings OPE1, OPE2, and OPE3 and second concave portions EB2_1 spaced apart from the side edges of the openings OPE1, OPE2 and OPE3 and disposed to surround the side edges of the openings OPE1, OPE2, and OPE3 with the first concave portions EB1_1 interposed therebetween, may be included. For example, the second concave portions EB2_1 may be disposed to be further spaced apart from the side edges of the openings OPE1, OPE2, and OPE3 than the first concave portions EB1_1. In other words, the first concave portions EB1_1 may be disposed to be relatively adjacent to the side edges of the openings OPE1, OPE2, and OPE3 as compared with the second concave portions EB2_1, and the second concave portions EB2_1 may be disposed to be relatively adjacent to the side edges of the holes OPT1, OPT2, and OPT3 as compared with the first concave portions EB1_1.

In FIGS. 19 and 20, the first concave portions EB1_1 and the second concave portions EB2_1 are illustrated as having the same size, but the disclosure is not limited thereto. For example, in some embodiments, the sizes of the first concave portions EB1_1 may be different from the sizes of the second concave portions EB2_1. Although FIGS. 19 and 20 illustrate that the first concave portions EB1_1 and the second concave portions EB2_1 are disposed side by side in the first direction DR1 or the second direction DR2, the disclosure is not limited thereto. For example, in some embodiments, the first concave portions EB1_1 and the second concave portions EB2_1 may be misaligned with each other. For example, the first concave portions EB1_1 disposed to be adjacent to the long side of the third emission area EA3 extending in the second direction DR2 may extend in the second direction DR2, and the second concave portions EB2_1 may be disposed to be spaced apart from the first concave portions EB1_1 in the first direction DR1 and may be arranged in the second direction DR2 while being misaligned with the first concave portions EB1_1.

Referring to FIG. 21 in addition to FIGS. 19 and 20, in an embodiment, the first concave portions EB1_1 may be positioned on the side surface of the second portion of the pixel defining layer PDL or the inclined surface of the pixel defining layer PDL described above, and the second concave portions EB2_1 may be positioned on the top surface of the second portion of the pixel defining layer PDL. The first concave portions EB1_1 and the second concave portions EB2_1 may be positioned on the second portion of the pixel defining layer PDL, so that the concave portion EB may not overlap the light blocking layer BM positioned on the pixel defining layer PDL.

In the display device 10_4 according to an embodiment, the concave portions EB_1 may be positioned on the top surface and the inclined surface of the pixel defining layer PDL, so that it may be possible to disperse the diffraction of the reflected light of external light by the common electrode CE positioned on the top surface of the pixel defining layer PDL and the inclined surface of the pixel defining layer PDL. For example, the concave portions EB_1 may be positioned in the areas of the pixel defining layer PDL, so that the diffraction due to the reflection of external light by the common electrode CE disposed on the entire surface of the pixel defining layer PDL may be diffracted in multiple areas of the pixel defining layer PDL.

Hereinafter, a method of manufacturing the display device 10 according to an embodiment will be described in detail with reference to FIGS. 22 to 26.

FIGS. 22 to 26 are schematic cross-sectional views showing the steps of a method of manufacturing a display device according to an embodiment.

Figure 22:
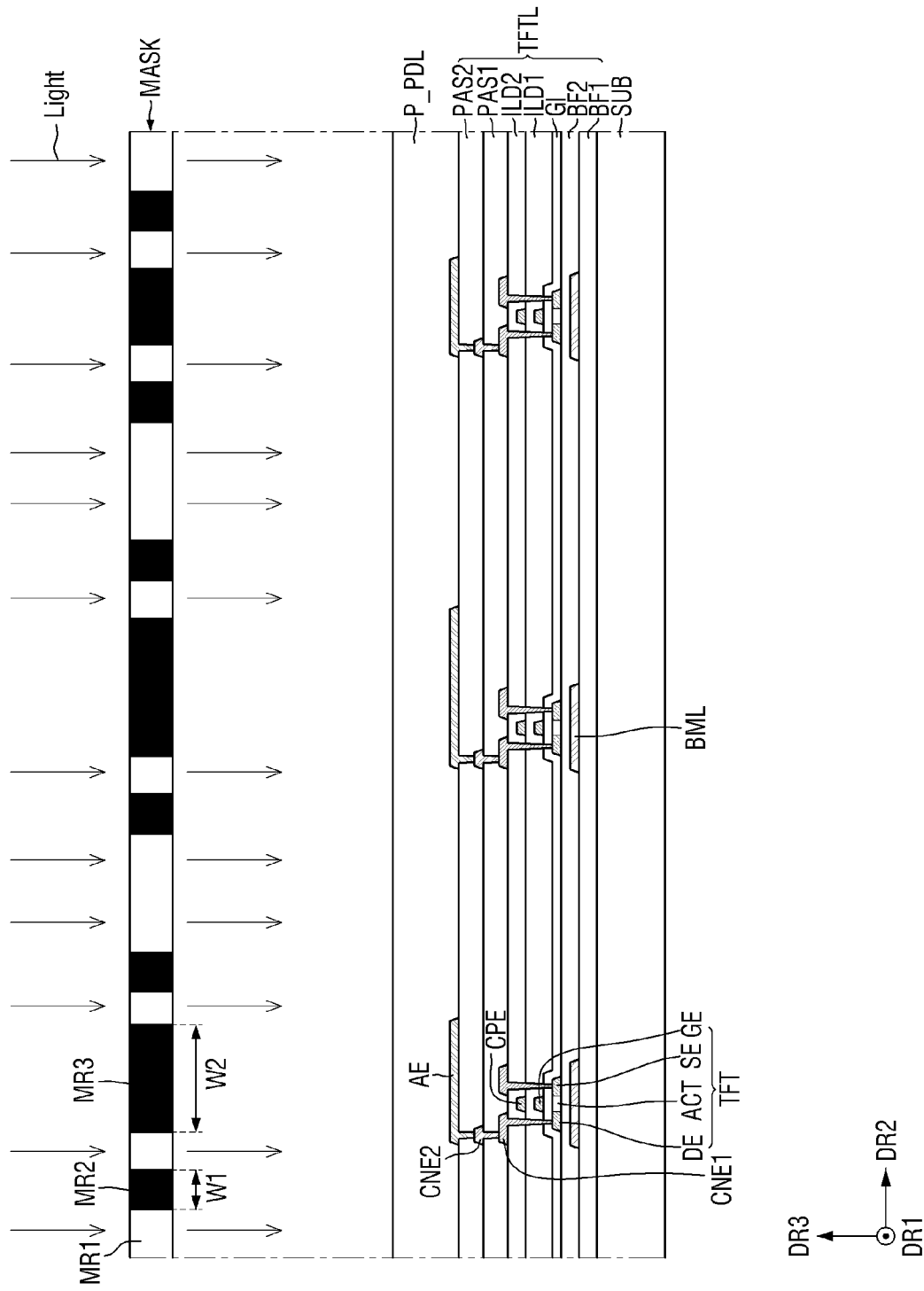
FIGS. 22 to 26 are schematic cross-sectional views showing steps of a method of manufacturing a display device according to an embodiment.
Figure 23:
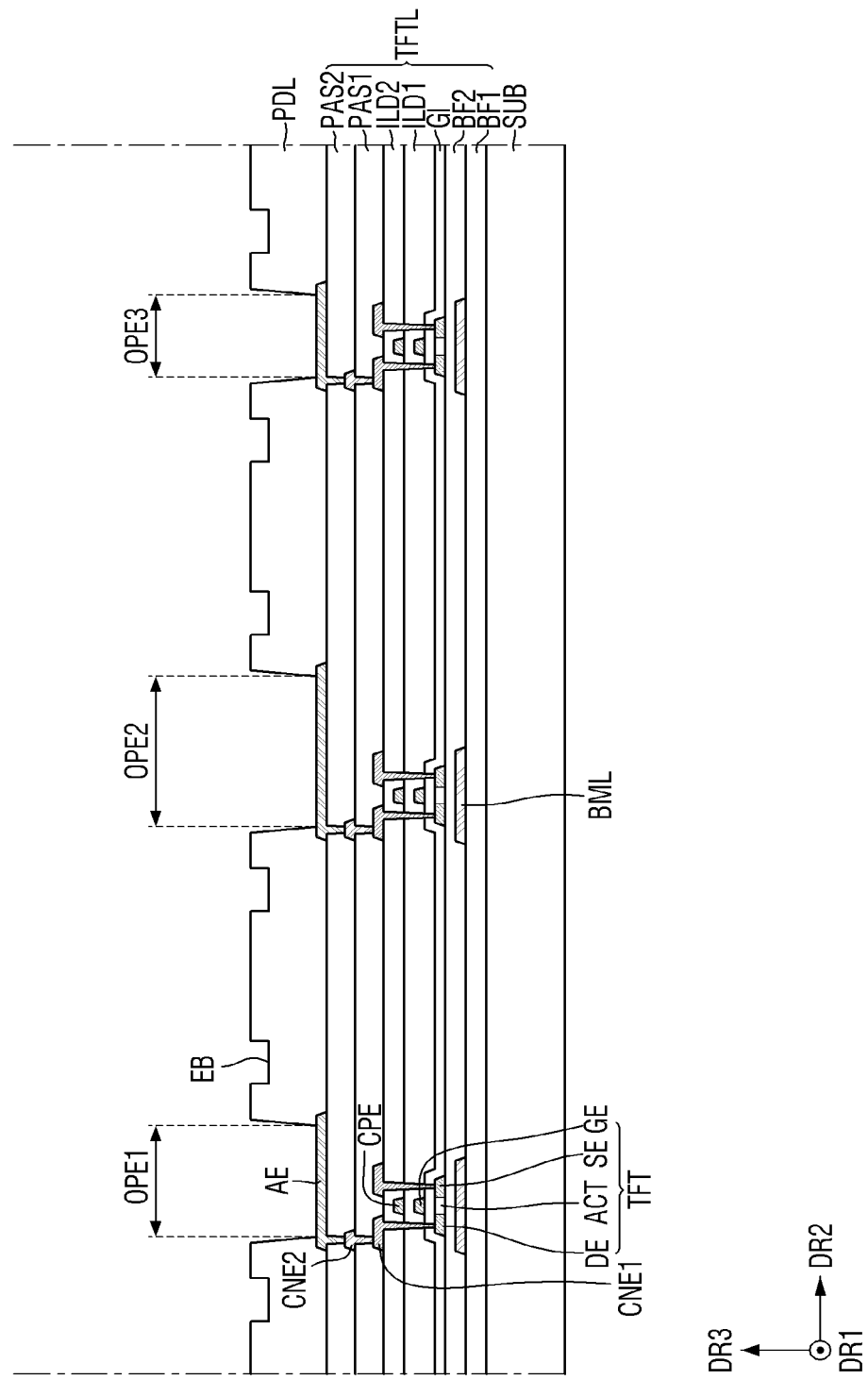

Referring to FIGS. 22 and 23, first, on a substrate SUB, an intermediate structure is prepared in which the first buffer layer BF1, the lower metal layer BML, the second buffer layer BF2, the thin film transistor TFT, the gate insulating layer GI, the first interlayer insulating layer ILD1, the capacitor electrode CPE, the second interlayer insulating layer ILD2, the first connection electrode CNE1, the first passivation layer PAS1, the second connection electrode CNE2, and the second passivation layer PAS2 may be sequentially stacked on each other. Various methods of forming such an intermediate structure may be performed.

A preliminary pixel defining layer P_PDL may be stacked on the pixel electrode AE.

The preliminary pixel defining layer P_PDL may be patterned by exposing and developing the pixel defining layer P_PDL by using a photomask MASK. The photomask MASK may include a light transmitting portion MR1, a first light blocking portion MR2, and a second light blocking portion MR3 having a width greater than the width of the first light blocking portion MR2.

In describing a case where the preliminary pixel defining layer P_PDL includes a negative photosensitive material as an example, the light transmitting portion MR1 may be disposed to correspond to an area in which the pixel defining layer PDL is to be formed, the first light blocking portion MR2 may be disposed to correspond to an area in which the concave portions EB are to be formed, the second light blocking portion MR3 may be disposed to correspond to an area in which the openings OPE1, OPE2, and OPE3 of the pixel defining layer PDL are to be formed, and the photomask MASK may be used to expose the preliminary pixel defining layer P_PDL.

The exposed preliminary pixel defining layer P_PDL may be developed to complete the pattern shape of the pixel defining layer PDL including the concave portions EB and the openings OPE1, OPE2 and OPE3 as illustrated in FIG. 23.

As such, in case that the process is performed using the photomask MASK having the first light blocking portion MR2 and the second light blocking portion MR3 having different widths, the concave portions EB and the openings OPE1, OPE2, and OPE3 of the pixel defining layer PDL may be formed in one process, thus process efficiency may increase.

As described above, the diameter and depth of the concave portions EB may vary according to a change in a width W1 of the first light blocking portion MR2 disposed to correspond to an area in which the concave portions EB are to be formed. For example, as the width W1 of the first light blocking portion MR2 of the photomask MASK may become larger, the diameter of each of the concave portions EB may become larger and the depth thereof may become deeper, and as the width W1 of the first light blocking portion MR2 may become smaller, the diameter of each of the concave portions EB may become smaller and the depth thereof may become shallower.

Accordingly, the width W1 of the first light blocking portion MR2 may need to be set appropriately such that the diameter and the depth are set such that the layers disposed under the pixel defining layer PDL may not be exposed while preventing the resolution of the display device 10 from being deteriorated by the concave portions EB.

In an embodiment, the width W1 of the first light blocking portion MR2 corresponding to an area in which the concave portions EB are to be formed may be smaller than the width W2 of the second light blocking portion MR2 corresponding to an area in which the openings OPE1, OPE2, and OPE3 are to be formed, and the width W1 of the first light blocking portion MR2 may have a value of about 3 μm or less. As such, in case that the width W1 of the first light blocking portion MR2 has a value of about 3 μm or less, during the process of exposing the preliminary pixel defining layer P_PDL, the concave portions EB may be recessed to a depth at which the second passivation layer PAS2 disposed under the preliminary pixel defining layer P_PDL may not be exposed.

In case that the first light blocking portion MR2 having the width W1 of about 3 μm or less is disposed and exposed in an area in which the concave portions EB are to be formed, the diameter of each of the concave portions EB may have a range of about 3 μm to about 5 μm.

In an embodiment, the description has focused on a case where the preliminary pixel defining layer P_PDL includes a negative photosensitive material, but in case that the preliminary pixel defining layer P_PDL includes a positive photosensitive material, the light transmitting portion MR1 of the photomask MASK and the light blocking portions MR2 and MR3 may be opposite to each other.

Figure 24:
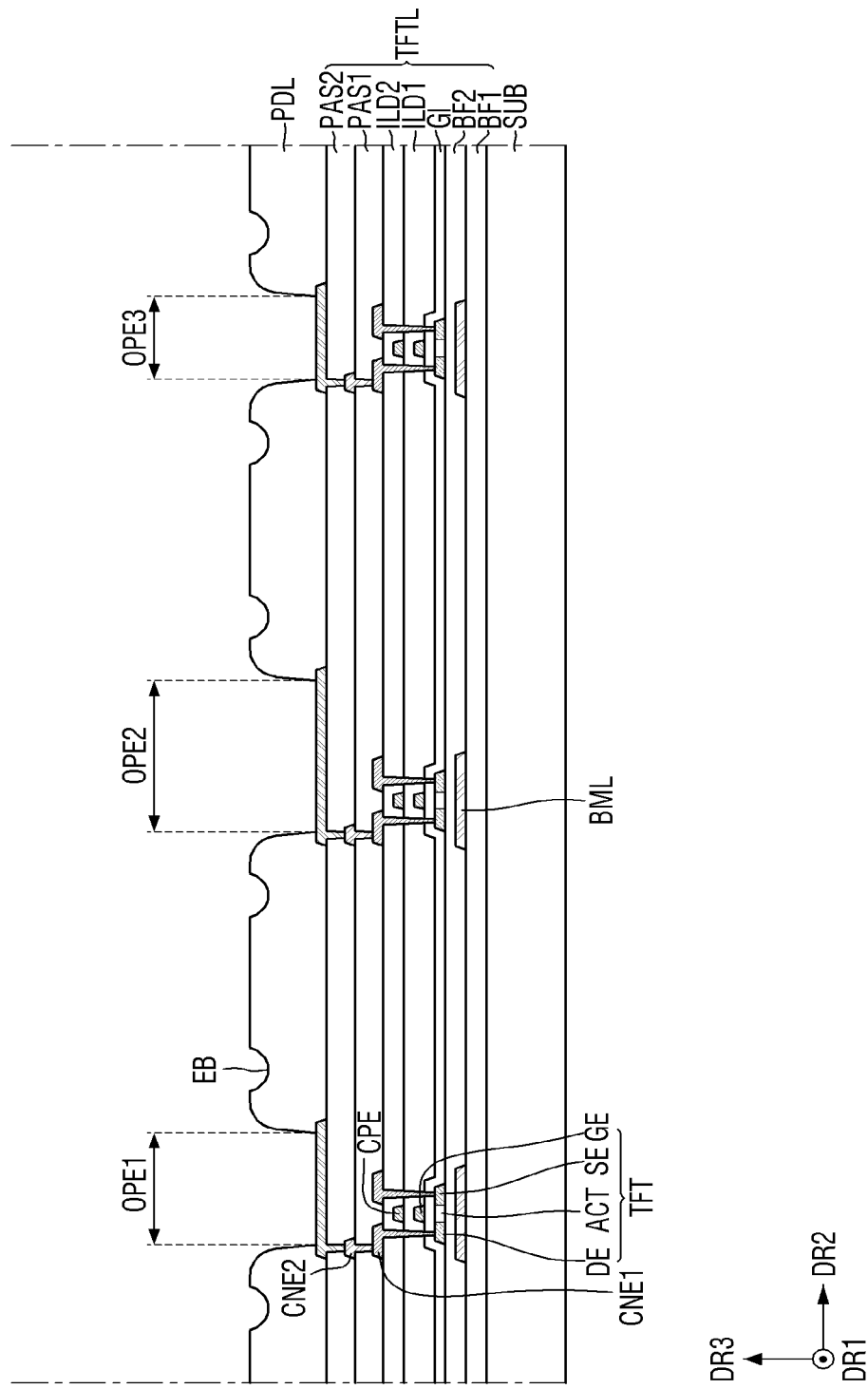

Referring to FIGS. 23 and 24, after the preliminary pixel defining layer P_PDL is developed, a curing step may be performed. Curing may be referred to as baking, firing, and the like. Curing may be performed in an oven at a predetermined or selectable temperature (e.g., about 230° C. to about 250° C.) for a predetermined or selectable time (e.g., about 30 minutes to about 60 minutes).

During curing, as the pixel defining layer PDL made of an organic material flows due to high temperature, the edges of the openings OPE1, OPE2, and OPE3 of the pixel defining layer PDL and the concave portions EB may form a curved shape.

Specifically, the end of the top surface of the pixel defining layer PDL and the side surface of the pixel defining layer PDL may have a curved shape. For example, the sidewalls of the openings OPE1, OPE2, and OPE3 of the pixel defining layer PDL may include a curved shape.

The concave portions EB may have a recessed structure including a curve in cross-sectional view while a curing process is undergone. For example, in the curing step, as the sidewalls of the concave portions EB having a linear shape flow down, the concave portions EB may have a semicircular recessed structure in cross-sectional view.

Figure 25:
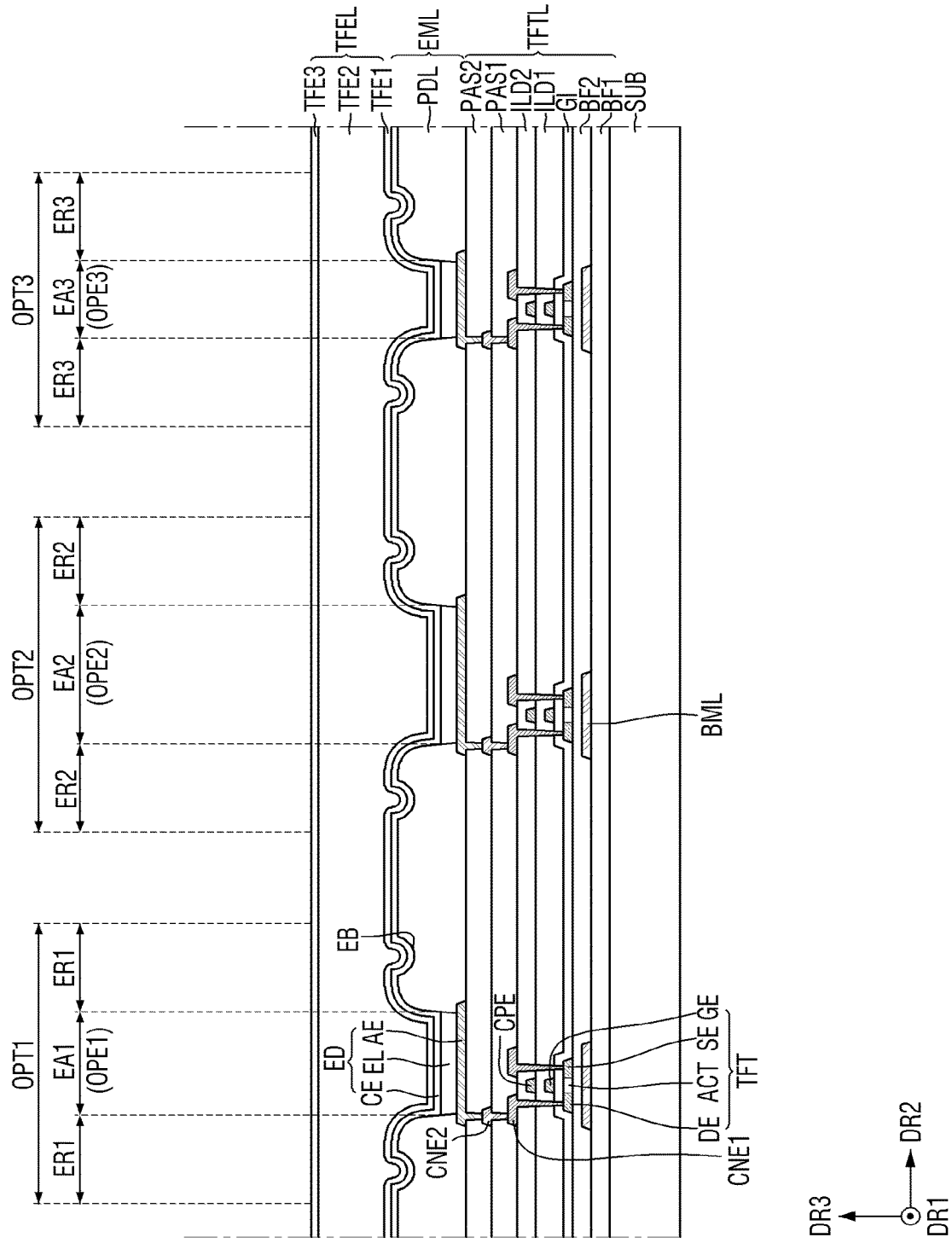
Figure 26:
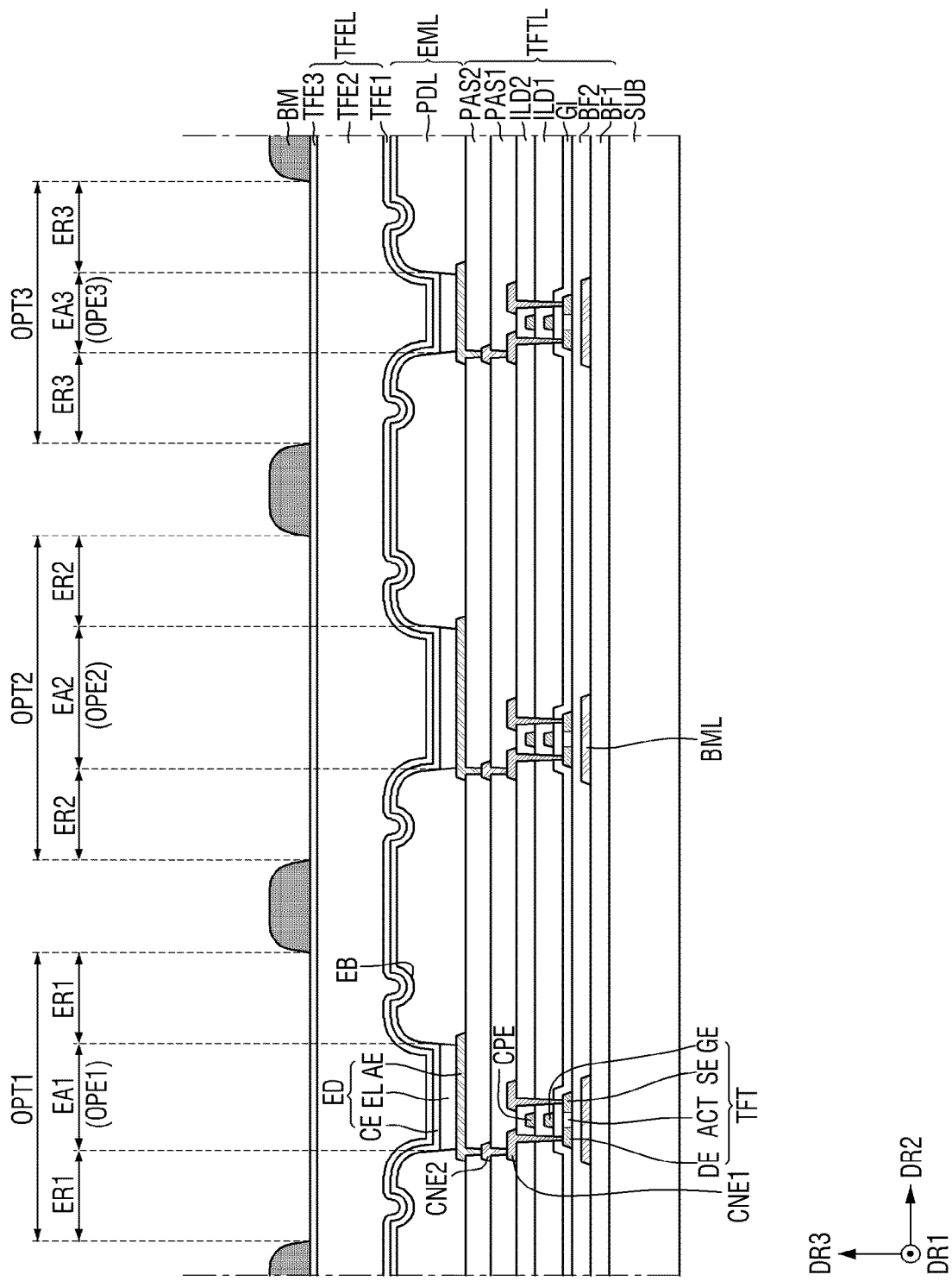

Referring to FIGS. 25 and 26, by various methods, the light emitting layer EL on the pixel electrode AE exposed by the openings OPE1, OPE2, and OPE3 of the pixel defining layer PDL may be formed, and the common electrode CE and the encapsulation layer TFEL including the first encapsulation layer TFE1, the second encapsulation layer TFE2, and the third encapsulation layer TFE3 may be sequentially formed on the light emitting layer EL and the pixel defining layer PDL.

The light blocking layer BM may be formed on the encapsulation layer TFEL.

Specifically, after depositing a preliminary light blocking layer on the entire surface of the encapsulation layer TFEL, a mask may be disposed on the preliminary light blocking layer, and the preliminary light blocking layer may be etched to form the holes OPT1, OPT2, and OPT3 corresponding to the openings OPE1, OPE2, and OPE3 of the pixel defining layer PDL. Etching for forming the holes OPT1, OPT2, and OPT3 of the light blocking layer BM may be performed through, for example, a laser etching, dry etching, or plasma etching process, but is not limited thereto.

Referring to FIG. 7 together with FIG. 26, the color filter layer CFL and the planarization layer OC may be sequentially formed on the light blocking layer BM.

Specifically, the color filters CF1, CF2, and CF3 of the color filter layer CFL may be formed on the light blocking layer BM. The different color filters CF1, CF2, and CF3 may be formed to correspond to the different emission areas EA1, EA2, and EA3 or the different openings OPE1, OPE2, and OPE3, and the different holes OPT1, OPT2, and OPT3 of the light blocking layer BM, respectively. The planarization layer OC may be formed to be disposed on the entire surface of the color filter layer CFL.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a plurality of pixel electrodes spaced apart from each other on a substrate;
   a pixel defining layer comprising a plurality of openings spaced apart from each other, and overlapping a portion of each of the plurality of pixel electrodes;
   a light blocking layer comprising a plurality of holes spaced apart from each other and overlapping the plurality of openings; and
   a plurality of color filters disposed in the plurality of holes of the light blocking layer and overlapping the plurality of openings,
   wherein the pixel defining layer comprises a first portion overlapping the light blocking layer and a second portion not overlapping the light blocking layer,
   the second portion comprises a first concave portion recessed from a surface of the second portion in a thickness direction, and
   the plurality of color filters are disposed to partially overlap each other on the light blocking layer, and
   wherein the first portion includes a flat upper surface having a width greater than a width of the first concave portion.

2. The display device of claim 1, wherein the first concave portion does not overlap the light blocking layer.

3. The display device of claim 1, wherein the first concave portion is disposed at a boundary between the first portion and the second portion.

4. The display device of claim 3, wherein a portion of the first concave portion disposed in the first portion overlaps the light blocking layer.

5. The display device of claim 1, wherein the first concave portion has a depth of about 0.3 μm to about 0.5 μm.

6. The display device of claim 1, wherein the first concave portion has a semicircular shape in cross-sectional view.

7. The display device of claim 1, wherein the second portion of the pixel defining layer comprises a top surface parallel to the substrate and a side surface extended to the top surface, and
   the first concave portion is positioned on the top surface of the second portion.

8. The display device of claim 7, wherein the second portion further comprises a second concave portion spaced apart from the first concave portion and disposed on the side surface of the second portion, and
   the second concave portion is recessed from a surface of the side surface in the thickness direction of the second portion.

9. The display device of claim 8, wherein a width of the second concave portion is different from a width of the first concave portion.

10. The display device of claim 9, wherein a depth of the second concave portion is different from a depth of the first concave portion.

11. The display device of claim 1, wherein the second portion of the pixel defining layer includes a top surface parallel to the substrate and a side surface extended to the top surface, and
    the first concave portion is positioned at a boundary between the top surface and the side surface.

12. The display device of claim 1, wherein the first concave portion has a width of about 3 μm to about 5 μm.

13. A display device comprising:
    a plurality of pixel electrodes disposed in a first direction and a second direction intersecting the first direction;
    a pixel defining layer overlapping a portion of each of the plurality of pixel electrodes and comprising a plurality of openings spaced apart from each other;
    a light blocking layer comprising a plurality of holes spaced apart from each other and overlapping the plurality of openings; and
    a plurality of color filters disposed in the plurality of holes of the light blocking layer and overlapping the plurality of openings,
    wherein the pixel defining layer comprises a plurality of first concave portions positioned in exposed portions of the pixel defining layer exposed by the plurality of holes, and spaced apart from each other, and
    the plurality of first concave portions are disposed to surround side edges of the plurality of openings in a plan view, and
    wherein the pixel defining layer includes a first portion overlapping the light blocking layer in a thickness direction, and the first portion includes a flat upper surface having a width greater than a width of each of the plurality of first concave portions.

14. The display device of claim 13, wherein a minimum distance between the plurality of first concave portions adjacent to each other is about 3 μm to about 7 μm.

15. The display device of claim 13, wherein the plurality of first concave portions do not overlap the light blocking layer.

16. The display device of claim 13, further comprising a plurality of second concave portions spaced apart from the side edges of the plurality of openings with the plurality of first concave portions interposed therebetween and disposed in the exposed portions of the pixel defining layer,
    wherein the plurality of second concave portions are spaced apart from each other and are disposed to surround the side edges of the plurality of openings in a plan view.

17. The display device of claim 13, wherein a distance between centers of the plurality of first concave portions adjacent to each other is about 5 μm to about 7 μm.

18. The display device of claim 13, further comprising a plurality of second concave portions disposed in the exposed portions of the pixel defining layer, and disposed between the plurality of first concave portions to surround the side edges of the plurality of openings, wherein a width of one of the plurality of first concave portions is different from a width of one of the plurality of second concave portions.

19. The display device of claim 18, wherein the plurality of first concave portions and the plurality of second concave portions are disposed alternately with each other.

20. The display device of claim 18, wherein the plurality of first concave portions do not overlap the light blocking layer in a plan view, and the plurality of second concave portions overlap a portion of the light blocking layer in a plan view.

\* \* \* \* \*